United States Patent
Chida et al.

(10) Patent No.: US 10,263,221 B2
(45) Date of Patent: *Apr. 16, 2019

(54) METHOD FOR MANUFACTURING LIGHT-EMITTING DEVICE

(71) Applicant: Semiconductor Energy Laboratory Co., Ltd., Kanagawa-ken (JP)

(72) Inventors: Akihiro Chida, Kanagawa (JP); Kaoru Hatano, Kanagawa (JP); Tomoya Aoyama, Kanagawa (JP); Ryu Komatsu, Kanagawa (JP); Masatoshi Kataniwa, Tochigi (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/922,288

(22) Filed: Mar. 15, 2018

(65) Prior Publication Data

US 2018/0205042 A1 Jul. 19, 2018

Related U.S. Application Data

(63) Continuation of application No. 15/141,157, filed on Apr. 28, 2016, now Pat. No. 9,923,174, which is a (Continued)

(30) Foreign Application Priority Data

May 4, 2012 (JP) .................. 2012-105553
Mar. 15, 2013 (JP) .................. 2013-053332

(51) Int. Cl.
*H01L 51/56* (2006.01)
*H01L 51/52* (2006.01)
(Continued)

(52) U.S. Cl.
CPC .......... *H01L 51/56* (2013.01); *H01L 27/1225* (2013.01); *H01L 27/3246* (2013.01);
(Continued)

(58) Field of Classification Search
CPC .......... H01L 27/32; H01L 51/52; H01L 51/56
(Continued)

(56) References Cited

U.S. PATENT DOCUMENTS 6,197,663 B1 3/2001 Chandross et al.
6,343,171 B1 1/2002 Yoshimura et al.
(Continued)

FOREIGN PATENT DOCUMENTS

CN 001417841 A 5/2003
CN 001591052 A 3/2005
(Continued)

OTHER PUBLICATIONS

Chinese Office Action re Application No. CN 201310144457.5, dated Jun. 1, 2016.
(Continued)

*Primary Examiner* — Sheng-Bai Zhu
(74) *Attorney, Agent, or Firm* — Husch Blackwell LLP

(57) ABSTRACT

A method for exposing an electrode terminal covered with an organic film in a light-emitting device without damaging the electrode terminal is provided. In a region of the electrode terminal to which electric power from an external power supply or an external signal is input, an island-shaped organic compound-containing layer is formed and the organic film is formed thereover. The organic film is removed by utilizing low adhesion of an interface between the organic compound-containing layer and the electrode terminal, whereby the electrode terminal can be exposed without damage to the electrode terminal.

18 Claims, 16 Drawing Sheets

Related U.S. Application Data continuation of application No. 13/871,248, filed on Apr. 26, 2013, now Pat. No. 9,331,310.

(51) Int. Cl.
*H01L 27/32* (2006.01)
*H01L 27/12* (2006.01)

(52) U.S. Cl.
CPC ...... *H01L 27/3276* (2013.01); *H01L 51/5203* (2013.01); *H01L 51/5237* (2013.01); *H01L 51/5246* (2013.01); *H01L 51/5253* (2013.01); H01L 2227/323 (2013.01); H01L 2227/326 (2013.01); H01L 2251/5338 (2013.01); H01L 2251/5361 (2013.01)

(58) Field of Classification Search
USPC ........................................................ 438/230
See application file for complete search history.

(56) References Cited

U.S. PATENT DOCUMENTS

| | | | |
|---|---|---|---|
| 6,515,428 B1 | 2/2003 | Yeh et al. | |
| 6,522,066 B2 | 2/2003 | Sheu et al. | |
| 6,614,174 B1 | 9/2003 | Urabe et al. | |
| 6,738,034 B2 | 5/2004 | Kaneko et al. | |
| 6,747,638 B2 | 6/2004 | Yamazaki et al. | |
| 6,798,132 B2 | 9/2004 | Satake | |
| 6,849,877 B2 | 2/2005 | Yamazaki et al. | |
| 6,894,431 B2 | 5/2005 | Yamazaki et al. | |
| 7,189,631 B2 | 3/2007 | Yamazaki et al. | |
| 7,247,881 B2 | 7/2007 | Lee et al. | |
| 7,311,953 B2 | 12/2007 | Araya et al. | |
| 7,332,381 B2 | 2/2008 | Maruyama et al. | |
| 7,402,945 B2 | 7/2008 | Yamazaki et al. | |
| 7,405,515 B2 | 7/2008 | Satake | |
| 7,547,612 B2 | 6/2009 | Yamazaki et al. | |
| 7,648,862 B2 | 1/2010 | Maruyama et al. | |
| 7,674,650 B2 | 3/2010 | Akimoto et al. | |
| 7,692,610 B2 | 4/2010 | Kimura | |
| 7,923,348 B2 | 4/2011 | Yamazaki et al. | |
| 7,994,506 B2 | 8/2011 | Maruyama et al. | |
| 8,012,854 B2 | 9/2011 | Yamazaki et al. | |
| 8,059,109 B2 | 11/2011 | Yamazaki et al. | |
| 8,173,520 B2 | 5/2012 | Yamazaki et al. | |
| 8,188,474 B2 | 5/2012 | Hatano et al. | |
| 8,222,666 B2 | 7/2012 | Hatano et al. | |
| 8,284,369 B2 | 10/2012 | Chida et al. | |
| 8,289,052 B2 | 10/2012 | Kawae | |
| 8,377,762 B2 | 2/2013 | Eguchi et al. | |
| 8,383,470 B2 | 2/2013 | Akimoto et al. | |
| 8,415,679 B2 | 4/2013 | Yamazaki et al. | |
| 8,415,881 B2 | 4/2013 | Satake | |
| 8,581,265 B2 | 11/2013 | Hatano et al. | |
| 8,653,544 B2 | 2/2014 | Boerner | |
| 8,853,940 B2 | 10/2014 | Satake | |
| 8,968,822 B2 | 3/2015 | Yamazaki et al. | |
| 8,980,700 B2 | 3/2015 | Maruyama et al. | |
| 9,117,976 B2 | 8/2015 | Hatano et al. | |
| 9,224,667 B2 | 12/2015 | Yamazaki et al. | |
| 9,331,310 B2 | 5/2016 | Chida et al. | |
| 9,401,458 B2 | 7/2016 | Hatano et al. | |
| 9,508,620 B2 | 11/2016 | Yamazaki et al. | |
| 9,620,408 B2 | 4/2017 | Maruyama et al. | |
| 9,793,329 B2 | 10/2017 | Hatano et al. | |
| 9,923,174 B2 * | 3/2018 | Chida .................... H01L 51/56 | |
| 9,929,190 B2 | 3/2018 | Yamazaki et al. | |
| 2001/0004066 A1* | 6/2001 | Toshima ........... H01L 21/02063 216/13 |
| 2001/0015618 A1 | 8/2001 | Yamazaki et al. | |
| 2005/0110023 A1 | 5/2005 | Lee et al. | |
| 2008/0073625 A1 | 3/2008 | Araya et al. | |
| 2009/0114915 A1 | 5/2009 | Toriumi | |
| 2010/0006845 A1 | 1/2010 | Seo et al. | |
| 2010/0045919 A1 | 2/2010 | Chida et al. | |
| 2010/0055833 A1 | 3/2010 | Uchida et al. | |
| 2010/0078627 A1 | 4/2010 | Yoshinaga | |
| 2010/0110041 A1 | 5/2010 | Jang | |
| 2010/0117072 A1 | 5/2010 | Ofuji et al. | |
| 2011/0084265 A1 | 4/2011 | Arasawa et al. | |
| 2011/0175101 A1 | 7/2011 | Hatano et al. | |
| 2011/0215362 A1 | 9/2011 | Ono et al. | |
| 2011/0278572 A1 | 11/2011 | Koyama | |
| 2011/0303930 A1 | 12/2011 | Bang et al. | |
| 2011/0316013 A1 | 12/2011 | Boerner | |
| 2012/0052606 A1 | 3/2012 | Yamazaki | |
| 2012/0061666 A1 | 3/2012 | Inoue et al. | |
| 2012/0061673 A1 | 3/2012 | Yamazaki et al. | |
| 2012/0061677 A1 | 3/2012 | Miyake | |
| 2012/0205675 A1 | 8/2012 | Yamazaki et al. | |
| 2012/0287027 A1 | 11/2012 | Koyama | |
| 2013/0033475 A1 | 2/2013 | Miyake | |
| 2013/0240855 A1 | 9/2013 | Chida et al. | |
| 2014/0077199 A1 | 3/2014 | Yamazaki et al. | |
| 2014/0306260 A1* | 10/2014 | Yamazaki ........... H01L 51/5012 257/99 |
| 2015/0243922 A1 | 8/2015 | Yamazaki et al. | |
| 2017/0207114 A1 | 7/2017 | Maruyama et al. | |
| 2017/0358639 A1 | 12/2017 | Hatano et al. | |

FOREIGN PATENT DOCUMENTS

| | | |
|---|---|---|
| CN | 001622715 A | 6/2005 |
| CN | 001708853 A | 12/2005 |
| CN | 101728420 A | 6/2010 |
| CN | 102341932 A | 2/2012 |
| CN | 103383991 A | 11/2013 |
| EP | 1 253 643 A2 | 10/2002 |
| EP | 2 178 133 A2 | 4/2010 |
| EP | 2 259 323 A2 | 12/2010 |
| JP | 62-040797 A | 3/1987 |
| JP | 07-080670 A | 3/1995 |
| JP | 2002-373779 A | 12/2002 |
| JP | 2008-277101 A | 11/2008 |
| JP | 2011-192567 A | 9/2011 |
| JP | 2012-003988 A | 1/2012 |
| JP | 2012-178262 A | 9/2012 |
| JP | 2013-251255 A | 12/2013 |
| KR | 2005-0049999 A | 5/2005 |
| KR | 2013-0124201 A | 11/2013 |
| TW | 543338 B | 7/2003 |
| TW | 201351631 | 12/2013 |
| WO | WO 2008/139940 A1 | 11/2008 |
| WO | WO 2010/100584 A2 | 9/2010 |

OTHER PUBLICATIONS

Taiwanese Office Action re Application No. TW 102114838, dated Jan. 25, 2017.
Chinese Office Action re Application No. CN 201710512150.4, dated Aug. 3, 2018.
Chinese Office Action re Application No. CN 201710506841.3, dated Aug. 3, 2018.

* cited by examiner

METHOD FOR MANUFACTURING LIGHT-EMITTING DEVICE

This application is a continuation of copending U.S. application Ser. No. 15/141,157, filed on Apr. 28, 2016 which is a continuation of U.S. application Ser. No. 13/871,248, filed on Apr. 26, 2013 (now U.S. Pat. No. 9,331,310 issued May 3, 2016), which are all incorporated herein by reference.

BACKGROUND OF THE INVENTION

1. Field of the Invention

The present invention relates to a method for manufacturing a light-emitting device.

2. Description of the Related Art

In recent years, research and development have been extensively conducted on light-emitting elements using electroluminescence (EL). In a basic structure of such a light-emitting element, a layer containing a substance with a light-emitting property is interposed between a pair of electrodes. By voltage application to this element, light emission can be obtained from the light-emitting substance.

The above light-emitting element is a self-luminous element; thus, a light-emitting device using the light-emitting element has advantages such as high visibility, no necessity of a backlight, and low power consumption. The light-emitting device using the light-emitting element also has advantages in that it can be manufactured to be thin and lightweight and has fast response speed.

Since a light-emitting device including the above light-emitting element can be flexible, application of the light-emitting device to a flexible substrate has been proposed.

As a method for manufacturing a light-emitting device using a flexible substrate, for example, a technique has been developed in which a semiconductor element such as a thin film transistor is manufactured over a substrate such as a glass substrate or a quartz substrate, a space between the semiconductor element and the substrate is filled with an organic resin, and then the semiconductor element is transferred to another substrate (e.g., a flexible substrate) from the glass substrate or the quartz substrate. After the semiconductor element is transferred to the flexible substrate, an opening needs to be formed in the organic resin and the substrate in order to electrically connect the semiconductor element to an external power supply.

As a method for forming a through hole in an interlayer insulating film formed of an organic resin, a new laser ablation method has been proposed (Patent Document 1).

REFERENCE

[Patent Document 1] Japanese Published Patent Application No. H07-80670

SUMMARY OF THE INVENTION

In the above light-emitting device using the flexible substrate, an opening needs to be formed in a layer of an organic film, a substrate, or the like provided over an electrode for connecting the semiconductor element included in the light-emitting device to an external power supply and a signal line. However, in the case where an opening is formed in the organic film or the substrate by a laser ablation method or the like, the bottom or periphery of the opening might be damaged due to heat, or the opening having a desired depth might not be able to be formed. In view of the above, an object of one embodiment of the present invention is to provide a method for manufacturing a light-emitting device in which an opening is formed in an organic film to a desired depth without damage to the bottom or periphery of the opening due to heat to expose an electrode terminal, so that the electrode terminal can be easily electrically connected to an external power supply or the like. Another object of one embodiment of the present invention is to provide a method for exposing an electrode terminal which is covered with an organic film or the like, without damaging the electrode terminal. Note that "damage due to heat" in this specification includes a burnt deposit, surface roughness, and the like.

One embodiment of the present invention is a method for manufacturing a light-emitting device, which includes the steps of forming an electrode terminal over a first substrate, forming a first electrode layer which is electrically connected to the electrode terminal, forming a partition wall which covers an edge portion of the first electrode layer, forming an organic compound-containing layer over the electrode terminal and the first electrode layer, forming a second electrode layer over the organic compound-containing layer, forming a separation layer over a second substrate, bonding the first substrate and the second substrate with an adhesive layer provided therebetween so that the separation layer and the second electrode layer face each other, separating the second substrate and forming an organic layer over a surface exposed by the separation, exposing the electrode terminal by making a cut surrounding a portion of the organic layer which overlaps with the electrode terminal and separating the adhesive layer and the organic layer surrounded by the cut, and forming a conductive layer which is electrically connected to the electrode terminal.

The organic compound-containing layer is formed in an island shape in a region of the electrode terminal to which electric power from an external power supply and an external signal are input as well as over the first electrode layer. An interface between the organic compound-containing layer and the electrode terminal has low adhesion, and for this reason, the adhesive layer formed over the organic compound-containing layer over the electrode terminal can be easily separated from the electrode terminal. Thus, a cut is made in the organic layer to separate the organic layer, whereby the electrode terminal can be exposed.

When the method for manufacturing a light-emitting device of one embodiment of the present invention is employed, the organic layer can be removed to expose the electrode terminal in a shorter time than in the case of employing a laser ablation method, a dry etching method, an ion beam sputtering method, or the like. Moreover, the organic layer can be removed without damaging the electrode terminal.

Another embodiment of the present invention is a method for manufacturing a light-emitting device, including the steps of forming a first separation layer over a first substrate; forming an electrode terminal over the first separation layer; forming a first electrode layer which is electrically connected to the electrode terminal; forming a partition wall which covers an edge portion of the first electrode layer; forming an organic compound-containing layer over the electrode terminal and the first electrode layer; forming a second electrode layer over the organic compound-containing layer; forming a second separation layer over a second substrate; bonding the first substrate and the second substrate with an adhesive layer provided therebetween so that the second separation layer and the second electrode layer face each other; separating the second substrate, forming a second organic layer over a surface exposed by the separation, and providing a second flexible substrate to be in contact with the second organic layer; separating the first substrate, forming a first organic layer over a surface exposed by the separation, and providing a first flexible substrate to be in contact with the first organic layer; exposing the electrode terminal by making a cut surrounding portions of the second flexible substrate and the second organic layer which overlap with the electrode terminal and separating the second flexible substrate, the adhesive layer, and the second organic layer surrounded by the cut; and forming a conductive layer which is electrically connected to the electrode terminal.

The organic compound-containing layer is formed in an island shape in a region of the electrode terminal to which electric power from an external power supply and an external signal are input as well as over the first electrode layer. An interface between the organic compound-containing layer and the electrode terminal has low adhesion. For this reason, the adhesive layer formed over the organic compound-containing layer over the electrode terminal can be easily separated from the electrode terminal. Thus, a cut is made in the second organic layer to separate the second organic layer, whereby the electrode terminal can be exposed.

When the method for manufacturing a light-emitting device of one embodiment of the present invention is employed, the second organic layer can be removed to expose the electrode terminal in a shorter time than in the case of employing a laser ablation method, a dry etching method, an ion beam sputtering method, or the like. Moreover, the second organic layer can be removed without damaging the electrode terminal.

The method for manufacturing a light-emitting device of one embodiment of the present invention enables a flexible light-emitting device to be obtained with the use of a flexible substrate.

Further, it is preferable that the second electrode layer have a light-transmitting property and that a step of forming a coloring layer over the separation layer (or the second separation layer) be performed after the step of forming the separation layer (or the second separation layer).

The method for manufacturing a light-emitting device of one embodiment of the present invention enables light emitted from a light-emitting element to come out from the second organic layer side. Moreover, since light emitted from the light-emitting element can come out through the coloring layer, a desired emission color can be obtained.

According to one embodiment of the present invention, an opening through which an electrode terminal is exposed can be made in an organic resin or the like without damaging the electrode terminal. A flexible light-emitting device in which power and a signal can be input from the electrode terminal can be provided.

DETAILED DESCRIPTION OF THE INVENTION

Figure 1A:
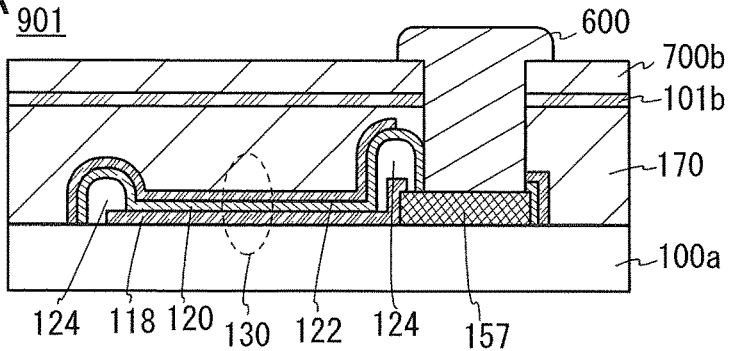
FIGS. 1A to 1D are each a cross-sectional view of a light-emitting device of one embodiment of the present invention.

Embodiments will be described in detail with reference to the accompanying drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments. Note that in the structures of the present invention described below, the same portions or portions having similar functions are denoted by the same reference numerals in different drawings, and description of such portions is not repeated.

(Embodiment 1)

FIG. 1A is a cross-sectional view illustrating a light-emitting device 901 which can be manufactured by a method for manufacturing a light-emitting device of one embodiment of the present invention. The light-emitting device 901 includes an electrode terminal 157 and a first electrode layer 118 over a first substrate 100a. An edge portion of the first electrode layer 118 is covered with a partition wall 124 to be insulated. An organic compound-containing layer 120 is in contact with at least the top surfaces of the first electrode layer 118 and the partition wall 124. There is a part in which the organic compound-containing layer 120 does not exist over the electrode terminal 157. A second electrode layer 122 is in contact with at least a top surface of the organic compound-containing layer 120. The second electrode layer 122 does not exist over the electrode terminal 157. An adhesive layer 170 is in contact with the second electrode layer 122. The adhesive layer 170 does not exist on the electrode terminal 157. A second separation layer 101b is in contact with a top surface of the adhesive layer 170. A second organic layer 700b is in contact with a top surface of the second separation layer 101b. The second organic layer 700b does not exist on the electrode terminal 157. A conductive layer 600 is electrically connected to the electrode terminal 157.

Note that a region, which consists of the first electrode layer 118, the organic compound-containing layer 120, and the second electrode layer 122 and is surrounded by the partition wall 124, is referred to as a light-emitting element 130.

(Substrate)

As the first substrate 100a may be a glass substrate, a quartz substrate, a sapphire substrate, a ceramic substrate, a metal substrate, or the like. Alternatively, the first substrate 100a may be a plastic substrate having heat resistance to the processing temperature of this embodiment.

In the case where a glass substrate is used and the temperature at which the heat treatment is to be performed later is high, a glass substrate whose strain point is greater than or equal to 730° C. is preferably used. As a glass substrate, for example, a glass material such as aluminosilicate glass, aluminoborosilicate glass, or barium borosilicate glass is used. Note that by containing a large amount of barium oxide (BaO), a glass substrate can be heat-resistant and more practical. Alternatively, crystallized glass or the like may be used.

(Electrode Terminal)

The electrode terminal 157 can be formed using a substance having electric conductivity, such as a metal or a semiconductor.

(First Electrode Layer)

A material which efficiently reflects light emitted from the organic compound-containing layer 120 formed later is preferably used for the first electrode layer 118, in which case light extraction efficiency can be improved. Note that the first electrode layer 118 may have a stacked-layer structure. For example, a conductive film formed of metal oxide, a titanium film, or the like is formed thin on the side which is in contact with the organic compound-containing layer 120, and a metal film which has high reflectance (e.g., a film of aluminum, an aluminum alloy, and silver) can be used on the other side. Such a structure is preferably employed, in which case the formation of an insulating film between the organic compound-containing layer 120 and the metal film which has high reflectance (e.g., the film of aluminum, an aluminum alloy, and silver) can be suppressed.

The light-emitting device having a top emission structure is described in this embodiment. In the case of a light-emitting device having a bottom emission structure or a dual emission structure, a light-transmitting material may be used for the first electrode layer 118.

(Partition Wall)

The partition wall 124 is provided in order to prevent an electrical short circuit between the adjacent first electrode layers 118. Although only one first electrode layer 118 is illustrated in the drawings, a plurality of first electrode layers 118 are provided in a light-emitting device in some cases. Further, in the case of using a metal mask for the formation of the organic compound-containing layer 120, which is described later, the organic compound-containing layers 120 of the light-emitting elements are separated over the partition wall 124. The partition wall 124 can be formed using an organic resin, an inorganic film, or the like.

(Organic Compound-containing Layer)

A structure of the organic compound-containing layer 120 will be described in Embodiment 3.

(Second Electrode Layer)

The second electrode layer 122 is preferably an electrode which can inject electrons into the organic compound-containing layer 120 described later and has a low work function. Not a single layer of a metal having a low work function but an electrode having the following structure is preferably used: a metal such as aluminum, a metal oxide such as indium-tin oxide, or a semiconductor is formed over a several-nanometer-thick layer of an alkali metal or an alkaline earth metal having a low work function, which is used as a buffer layer. An oxide of an alkali metal or an alkaline earth metal or a halide thereof can also be used for the buffer layer. An alloy of magnesium and silver, or the like can be used as the second electrode layer 122.

Further, in the case where light emitted from the light-emitting element comes out through the second electrode layer 122, the second electrode layer 122 preferably transmits visible light.

(Adhesive Layer)

The adhesive layer 170 is in contact with the second electrode layer 122. The second separation layer 101b and the first substrate 100a are fixed to each other by the adhesive layer 170. For the adhesive layer 170, a light curable adhesive, a reactive curable adhesive, a heat curable adhesive, or an anaerobic adhesive can be used. For example, an epoxy resin, an acrylic resin, an imide resin, or the like can be used. A dry agent (zeolite or the like) having a size less than or equal to the wavelength of light, or a filler with a high refractive index (titanium oxide, zirconium, or the like) is preferably mixed into the adhesive, in which case the reliability and light extraction efficiency of the light-emitting element 130 are improved.

(Separation Layer)

The second separation layer 101b has a single-layer structure or a stacked-layer structure which contains an element selected from tungsten, molybdenum, titanium, tantalum, niobium, nickel, cobalt, zirconium, ruthenium, rhodium, palladium, osmium, iridium, or silicon, an alloy material containing any of the elements, or a compound material containing any of the elements. A crystal structure of a layer containing silicon may be amorphous, microcrystal, or polycrystal. The second separation layer 101b may be formed using a metal oxide such as aluminum oxide, gallium oxide, zinc oxide, titanium dioxide, indium oxide, indium tin oxide, indium zinc oxide, or an In—Ga—Zn-based oxide.

The second separation layer 101b can be formed by a sputtering method, a plasma CVD method, a coating method, a printing method, or the like. Note that the coating method includes, in its category, a spin coating method, a droplet discharge method, and a dispensing method.

In the case where the second separation layer 101b has a single-layer structure, a tungsten layer, a molybdenum layer, or a layer including a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum is formed. Note that the mixture of tungsten and molybdenum corresponds to, for example, an alloy of tungsten and molybdenum.

In the case where the second separation layer 101b has a stacked-layer structure including a layer containing tungsten and a layer containing an oxide of tungsten, the following structure may be employed: the layer containing tungsten is formed first and an insulating layer formed of an oxide is formed thereover so that the layer containing an oxide of tungsten is formed at the interface between the tungsten layer and the insulating layer. Alternatively, the layer containing oxide of tungsten may be formed by performing thermal oxidation treatment, oxygen plasma treatment, treatment with a highly oxidizing solution such as ozone water, or the like on the surface of the layer containing tungsten. Note that the second separation layer 101b and the first separation layer 101a described later can be formed using the same material.

(Second Organic Layer)

The second organic layer 700b is in contact with the second separation layer 101b. The second organic layer 700b can be formed using an organic resin. For example, an epoxy resin, an acrylic resin, an imide resin, or the like can be used.

(Conductive Layer)

The conductive layer 600 is electrically connected to the electrode terminal 157. The conductive layer 600 can be formed using a conductive paste such as a silver paste, a film or a paste which contains an anisotropic conductor, a metal deposited by a sputtering method, or the like can be used.

<Method for Manufacturing Light-emitting Device>

FIGS. 2A to 2E illustrate a method for manufacturing a light-emitting device of one embodiment of the present invention. The cross-sectional views illustrate a manufacturing method up to and including the formation of the second electrode layer 122. The above description can be referred to for the materials of the components described below.

Figure 2A:
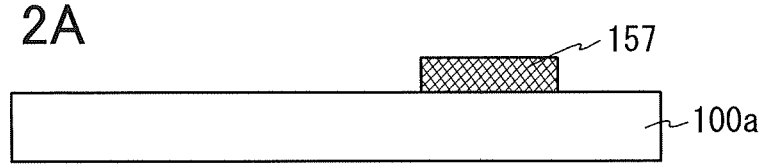
FIGS. 2A to 2E are cross-sectional views illustrating a method for manufacturing a light-emitting device of one embodiment of the present invention.

First, the electrode terminal 157 is formed over the first substrate 100a (FIG. 2A). The electrode terminal 157 may be formed by a sputtering method or the like.

Figure 2B:
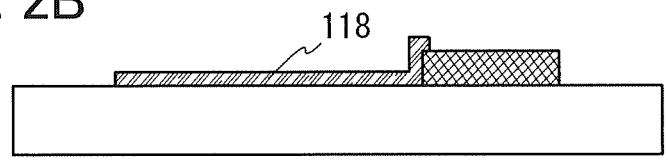

Next, the first electrode layer 118 is formed over the first substrate 100a (FIG. 2B). The first electrode layer 118 is electrically connected to the electrode terminal 157. The first electrode layer 118 is formed in such a manner that a conductive film is formed by an evaporation method or a sputtering method and then processed into a desired shape by photolithography.

Figure 2C:
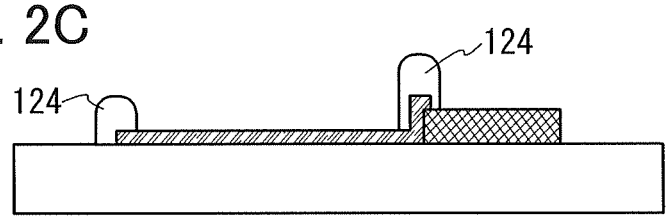

Next, the partition wall 124 is formed so as to cover an edge portion of the first electrode layer 118 (FIG. 2C). The partition wall 124 is formed in such a manner that an organic resin is formed by a coating method and processed into a desired shape by photolithography.

Figure 2D:
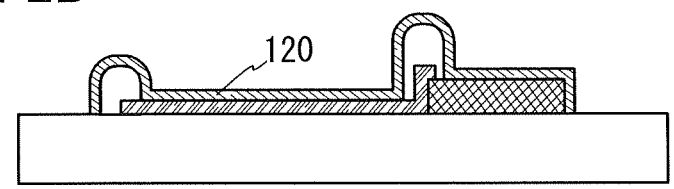

Next, the organic compound-containing layer 120 is formed so as to be in contact with the electrode terminal 157, the first electrode layer 118, and the partition wall 124 (FIG. 2D). An interface between the organic compound-containing layer 120 and the electrode terminal 157 has low adhesion. For this reason, forming the organic compound-containing layer 120 so as to be in contact with the electrode terminal 157 allows the organic compound-containing layer 120 to be easily separated from the electrode terminal 157 in a later step. Thus, the electrode terminal 157 can be exposed.

Figure 2E:
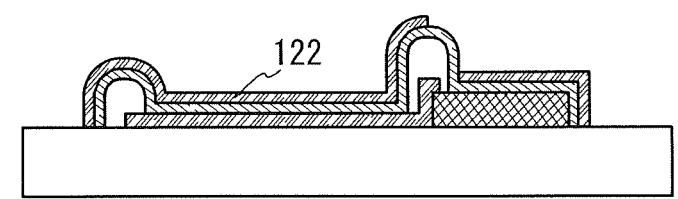

Next, the second electrode layer 122 is formed so as to be in contact with the organic compound-containing layer 120 (FIG. 2E). The second electrode layer 122 can be formed by an evaporation method, a sputtering method, or the like.

FIGS. 3A to 3D illustrate the steps up to and including the formation of the second separation layer 101b over the second substrate 100b and the formation of the second organic layer 700b.

Figure 3A:
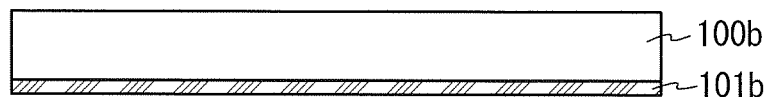
FIGS. 3A to 3D are cross-sectional views illustrating the method for manufacturing a light-emitting device of one embodiment of the present invention.

The second separation layer 101b is formed so as to be in contact with the second substrate 100b (FIG. 3A). The second substrate 100b can be formed using the same material as the first substrate 100a. The second separation layer 101b can be formed by a sputtering method, an evaporation method, or the like.

Figure 3B:
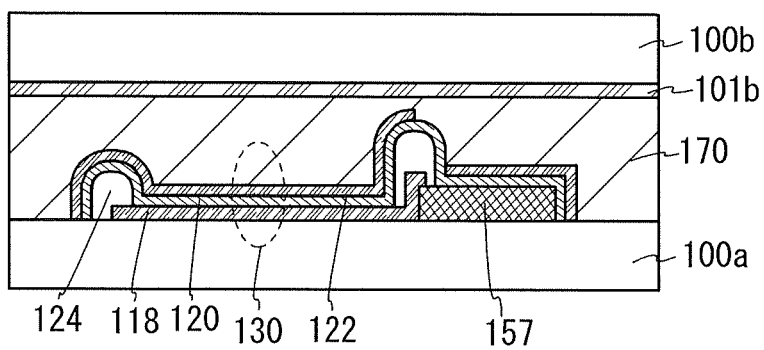

Next, the adhesive layer 170 is applied so as to be in contact with the second separation layer 101b which is in contact with the second substrate 100b. The second electrode layer 122 and the second separation layer 101b are fixed to each other by the applied adhesive layer 170 (FIG. 3B). The light-emitting element 130 is protected by the adhesive layer 170; thus, the light-emitting device can have high reliability.

Figure 3C:
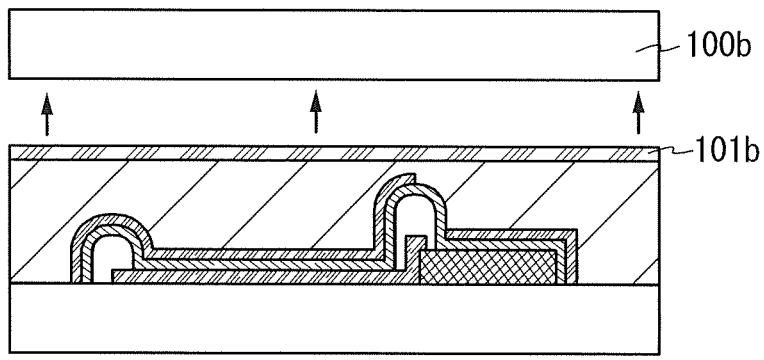

Next, the second substrate 100b is separated from the light-emitting device (FIG. 3C). As a separation method, mechanical force (a separation process with a human hand or with a gripper, a separation process by rotation of a roller, ultrasonic wave treatment, or the like) may be used. For example, a cut is made in the second separation layer 101b with a sharp knife or by laser light irradiation, and water is injected into the cut. A portion between the second separation layer 101b and the second substrate 100b absorbs water through capillary action, so that the second substrate 100b can be easily separated from the light-emitting device. Note that in the case where a cut is made by laser light irradiation, the first substrate 100a or the second substrate 100b may be irradiated with laser light.

Figure 3D:
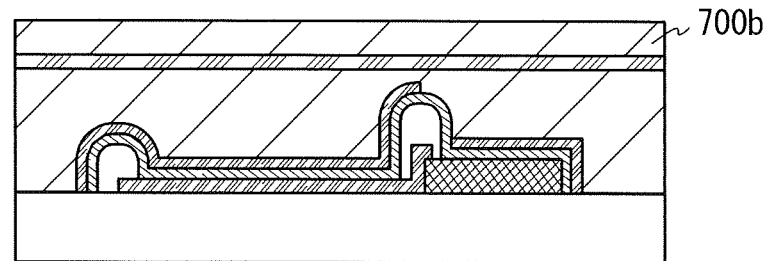

Next, dust on the second separation layer 101b is removed and the second organic layer 700b is formed over the second separation layer 101b (FIG. 3D).

Figure 4A:
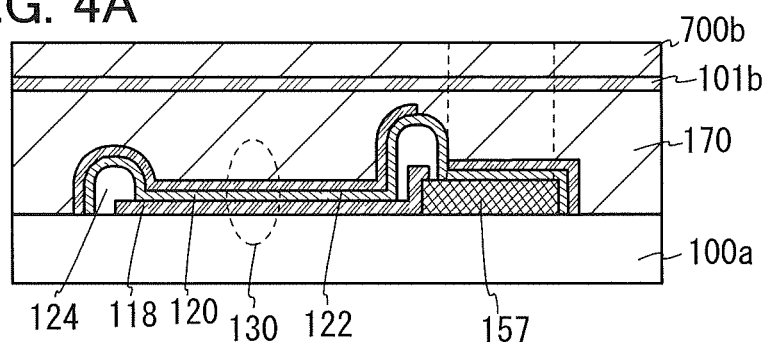
FIGS. 4A to 4C are cross-sectional views illustrating the method for manufacturing a light-emitting device of one embodiment of the present invention.
Figure 4B:
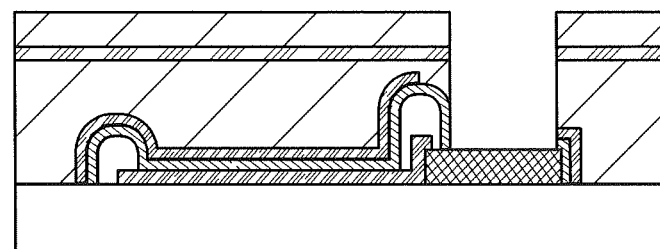
Figure 4C:
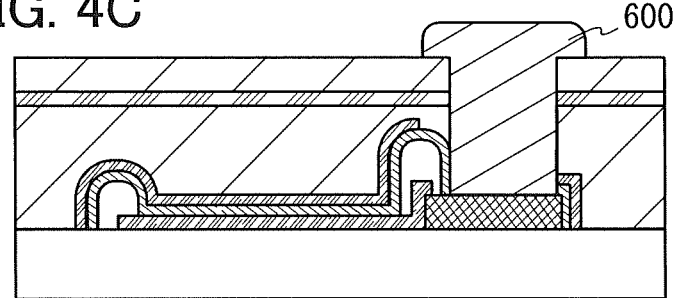

FIGS. 4A to 4C illustrate the steps from making a cut in the second organic layer 700b, the second separation layer 101b, and the adhesive layer 170 so as to surround a portion overlapping with the electrode terminal 157 up to and including the formation of the conductive layer 600.

The cut is made in the second organic layer 700b, the second separation layer 101b, and the adhesive layer 170 so as to surround the portion overlapping with the electrode terminal 157 (FIG. 4A). The cut may be made with a sharp knife or the like.

Next, part of the second organic layer 700b in which the cut is made so as to surround the portion overlapping with the electrode terminal 157 may be pulled in the direction in which the second organic layer 700b is separated from the light-emitting device. For example, an adhesive tape is attached to the second organic layer 700b and then the tape is pulled in the direction in which the second organic layer 700b is separated from the light-emitting device. The interface between the organic compound-containing layer 120 and the electrode terminal 157 has low adhesion, and for this reason, the electrode terminal 157 can be exposed (FIG. 4B). Through the above steps, an opening reaching the electrode terminal 157 can be formed in the second organic layer 700b, the second separation layer 101b, the adhesive layer 170, and the organic compound-containing layer 120. Note that part of the organic compound-containing layer 120 remains on the electrode terminal 157 after the separation of the second organic layer 700b in some cases. Note that the organic compound-containing layer 120 remaining on the electrode terminal 157 might cause poor adhesion or electrical connection failure between the electrode terminal 157 and the conductive layer 600 formed later. Thus, it is preferable to remove the organic compound-containing layer 120 remaining on the electrode terminal 157 with an organic solvent such as acetone, or the like.

Next, the opening formed through the above steps is filled with the conductive layer 600 (FIG. 4C). The conductive layer 600 is preferably formed using a silver paste or the like. Electric power from an external power supply and an external signal can be input through the conductive layer 600. Alternatively, the following method may be employed: an anisotropic conductive film or an anisotropic conductive paste is formed as the conductive layer 600, a flexible printed circuit (FPC) is provided thereover, and then the FPC and the electrode terminal 157 are electrically connected to each other through the conductive layer 600 by thermocompression bonding. Further alternatively, an IC chip may be mounted, instead of the FPC, directly onto the conductive layer 600.

The method for manufacturing a light-emitting device of one embodiment of the present invention enables an opening to be formed in a desired position of a resin or the like in which an opening is difficult to form by a laser ablation method. Further, without damaging the electrode terminal 157, an opening can be formed in a resin or the like in which an opening is difficult to form.

<Modification Example 1 of Method for Manufacturing Light-emitting Device>

Figure 1B:
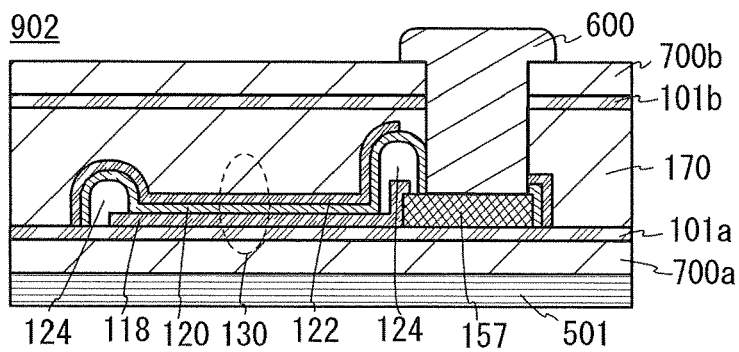

FIG. 1B is a cross-sectional view of a light-emitting device 902 which can be manufactured by a method for manufacturing a light-emitting device of one embodiment of the present invention. The light-emitting device 902 includes a flexible substrate 501 and the second organic layer 700b, and is thus flexible. The method for manufacturing the light-emitting device 902 is different from the method for manufacturing the light-emitting device 901 in that the first separation layer 101a is formed between the first substrate 100a and the light-emitting element 130.

In this modification example, in the case of using a glass substrate as the first substrate 100a, an insulating layer such as a silicon oxide film, a silicon oxynitride film, a silicon nitride film, or a silicon nitride oxide film is preferably formed between the first substrate 100a and the first separation layer 101a, in which case contamination due to an alkali metal from the glass substrate can be prevented.

In the light-emitting device 902, a first organic layer 700a is provided in contact with a top surface of the flexible substrate 501. The first separation layer 101a is in contact with a top surface of the first organic layer 700a. The electrode terminal 157 and the first electrode layer 118 are formed over the first separation layer 101a. An edge portion of the first electrode layer 118 is covered with the partition wall 124 to be insulated. The organic compound-containing layer 120 is in contact with at least top surfaces of the electrode terminal 157, the first electrode layer 118, and the partition wall 124. The organic compound-containing layer 120 over the electrode terminal 157 is removed at the time of the formation of an opening in the adhesive layer 170 and the like, which is described later. The second electrode layer 122 is in contact with at least a top surface of the organic compound-containing layer 120. The second electrode layer 122 over the electrode terminal 157 is also removed at the time of the formation of the opening in the adhesive layer 170 and the like. The adhesive layer 170 is in contact with the second electrode layer 122. The adhesive layer 170 over the electrode terminal 157 is also removed at the time of the formation of the opening in the adhesive layer 170 and the like. The second separation layer 101b is in contact with a top surface of the adhesive layer 170. The second separation layer 101b over the electrode terminal 157 is also removed at the time of the formation of the opening in the adhesive layer 170 and the like. The second organic layer 700b is in contact with a top surface of the second separation layer 101b. The second organic layer 700b over the electrode terminal 157 is also removed at the time of the formation of the opening in the adhesive layer 170 and the like. The conductive layer 600 is electrically connected to the electrode terminal 157.

FIGS. 5A to 5E illustrate only steps in the manufacturing process of the light-emitting device 902 which are different from those in the manufacturing process of the light-emitting device 901. Embodiment 1 can be referred to for the other steps.

Figure 5A:
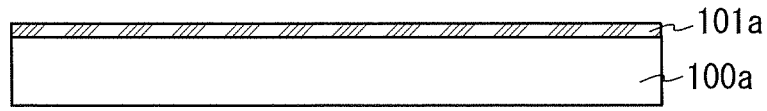
FIGS. 5A to 5E are cross-sectional views illustrating a method for manufacturing a light-emitting device of one embodiment of the present invention.

The first separation layer 101a is formed so as to be in contact with the first substrate 100a (FIG. 5A). The first separation layer 101a can be formed using the same material as the second separation layer 101b.

Figure 5B:
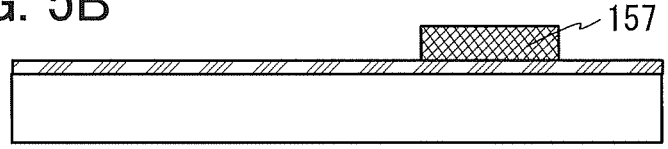

Next, the electrode terminal 157 is formed in contact with the first separation layer 101a (FIG. 5B).

Figure 5C:
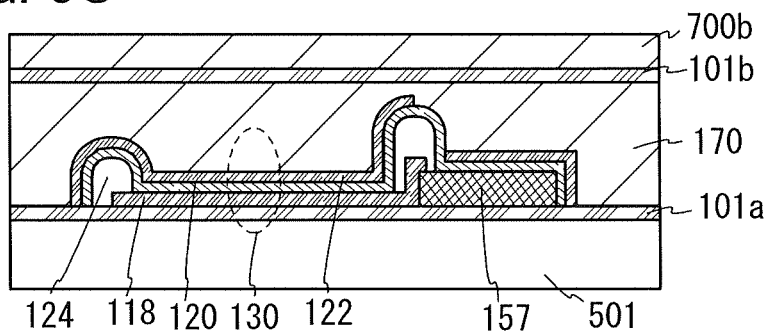

FIGS. 2B to 2E and FIGS. 3A to 3D in Embodiment 1 can be referred to for the steps from the formation of the first electrode layer 118 up to and including the formation of the second organic layer 700b. One surface of the light-emitting device is formed of the second organic layer 700b (FIG. 5C). In the steps described below, the other substrate is separated from the light-emitting device and the light-emitting device is transferred to the flexible substrate 501, so that a flexible light-emitting device is manufactured.

Figure 5D:
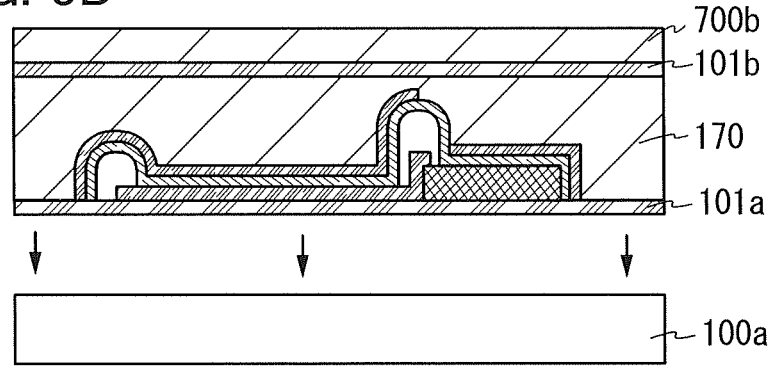

The first substrate 100a is separated from the light-emitting device (FIG. 5D). As a separation method, mechanical force (a separation process with a human hand or with a gripper, a separation process by rotation of a roller, ultrasonic wave treatment, or the like) may be used. For example, a cut is made in the first separation layer 101a with a sharp knife or by laser light irradiation, and water is injected into the cut. A portion between the first separation layer 101a and the first substrate 100a absorbs water through capillarity action, so that the first substrate 100a can be easily separated from the light-emitting device. Note that in the case where a cut is made by laser light irradiation, the second substrate 100b or the first substrate 100a may be irradiated with laser light.

Figure 5E:
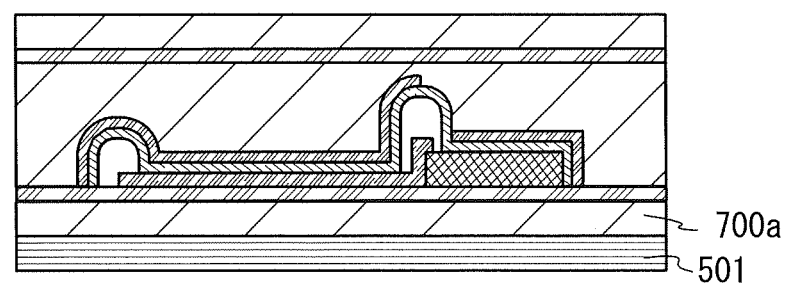

Next, water on the first separation layer 101a is removed, the first organic layer 700a is formed in contact with the first separation layer 101a, and the flexible substrate 501 is bonded to the first organic layer 700a (FIG. 5E).

As the flexible substrate 501, a substrate which has flexibility and transmits visible light can be used: for example, a polyethylene terephthalate resin, a polyethylene naphthalate resin, a polyacrylonitrile resin, a polyimide resin, a polymethylmethacrylate resin, a polycarbonate resin, a polyethersulfone resin, a polyamide resin, a cycloolefin resin, a polystyrene resin, a polyamide imide resin, a polyvinylchloride resin, or the like is preferably used. Further, the coefficient of thermal expansion of the flexible substrate 501 is preferably lower than or equal to 30 ppm/K, more preferably lower than or equal to 10 ppm/K. In addition, over the flexible substrate 501, a protective film which has low water permeability may be formed in advance; examples of the protective film include a film containing nitrogen and silicon such as a silicon nitride film or a silicon oxynitride film and a film containing nitrogen and aluminum such as an aluminum nitride film. Note that a structure in which a fibrous body is impregnated with an organic resin (also called prepreg) may be used as the flexible substrate 501.

Figure 6A:
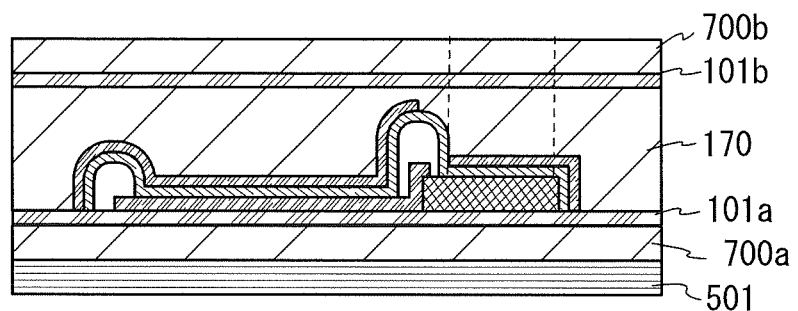
FIGS. 6A to 6C are cross-sectional views illustrating the method for manufacturing a light-emitting device of one embodiment of the present invention.
Figure 6B:
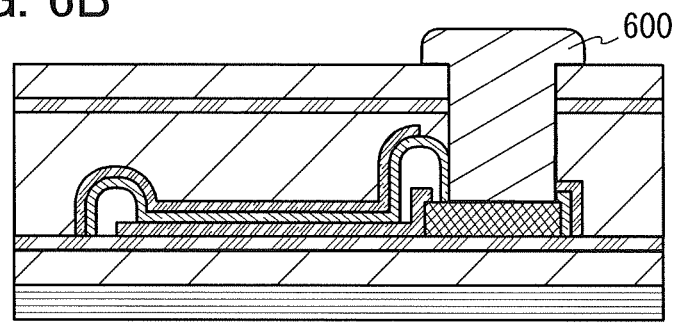
Figure 6C:
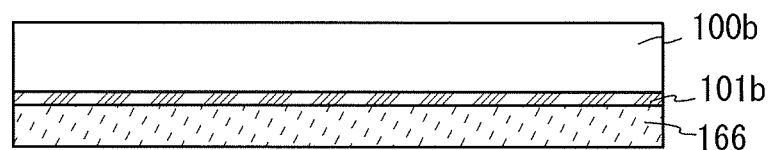

FIGS. 6A to 6C illustrate the steps from making a cut in the second organic layer 700b, the second separation layer 101b, and the adhesive layer 170 so as to surround a portion overlapping with the electrode terminal 157 up to and including the formation of the conductive layer 600.

The cut is made in the second organic layer 700b, the second separation layer 101b, and the adhesive layer 170 so as to surround the portion overlapping with the electrode terminal 157 (FIG. 6A). The cut may be made with a sharp knife or the like.

Next, part of the second organic layer 700b in which the cut is made so as to surround the portion overlapping with the electrode terminal 157 is pulled in the direction in which the second organic layer 700b is separated from the light-emitting device. The interface between the organic compound-containing layer and the electrode terminal has low adhesion, and for this reason, the electrode terminal 157 can be exposed.

Next, the opening formed through the above steps is filled with the conductive layer 600 (FIG. 6B). The conductive layer 600 is preferably formed using a silver paste or the like. Electric power from an external power supply and an external signal can be input through the conductive layer 600. Alternatively, the following method may be employed: an anisotropic conductive film or an anisotropic conductive paste is formed as the conductive layer 600 and a flexible printed circuit (FPC) is provided thereover, and then the FPC and the electrode terminal 157 are electrically connected to each other through the conductive layer 600 by thermocompression bonding. Further alternatively, an IC chip may be mounted, instead of the FPC, directly onto the conductive layer 600.

The method for manufacturing a light-emitting device of one embodiment of the present invention enables an opening to be formed in a resin or the like in which an opening is difficult to form in a region overlapping with the electrode terminal 157. Further, without damaging the electrode terminal 157, an opening can be formed in a resin or the like in which an opening is difficult to form.

The light-emitting device includes the flexible substrate 501 and the second organic layer 700b, and is thus flexible.

<Modification Example 2 of Method for Manufacturing Light-emitting Device>

Figure 1C:
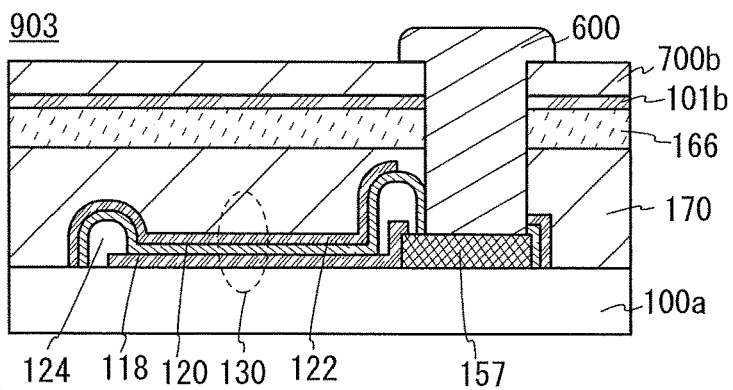

FIG. 1C is a cross-sectional view of a light-emitting device 903 which can be manufactured by a method for manufacturing a light-emitting device of one embodiment of the present invention. In the light-emitting device 903, a coloring layer 166 is provided between the adhesive layer 170 and the second separation layer 101b. The other structures are the same as those of the light-emitting device 901; thus, the above embodiment can be referred to for the other structures. Therefore, only a method for forming the coloring layer 166 will be described below.

The formation steps of the light-emitting device 901 (FIGS. 2A to 2E) can be referred to for the steps up to and including the formation of the second electrode layer 122.

(Coloring Layer)

The coloring layer 166 is formed on the second separation layer 101b on the second substrate 100b. Note that in FIG. 6C, the second separation layer 101b and the coloring layer 166 are positioned below the second substrate 100b. The coloring layer 166 is also called a color filter and is a colored layer which transmits light in a specific wavelength range. For example, a red coloring layer which transmits light of a red wavelength range, a green coloring layer which transmits light of a green wavelength range, a blue coloring layer which transmits light of a blue wavelength range, or the like can be used. Each coloring layer may be formed using a known material by a printing method, an inkjet method, or an etching method using photolithography (FIG. 6C).

The coloring layer 166 which is formed on the second substrate 100b may be bonded to the second electrode layer 122 with the adhesive layer 170 provided therebetween. Embodiment 1 can be referred to for the step.

The second substrate 100b is separated from the light-emitting device. Embodiment 1 can be referred to for the steps of separating the second substrate 100b from the light-emitting device and forming the second organic layer 700b.

Embodiment 1 can also be referred to for the method of exposing the electrode terminal 157.

The method for manufacturing a light-emitting device of one embodiment of the present invention enables an opening to be formed in a region overlapping with the electrode terminal 157. The opening can be formed in a resin or the like without damaging the electrode terminal 157.

Light emitted from the light-emitting element can come out through the coloring layer from the light-emitting device manufactured by the method for manufacturing a light-emitting device; thus, a desired emission color can be obtained.

<Modification Example 3 of Method for Manufacturing Light-emitting Device>

Figure 1D:
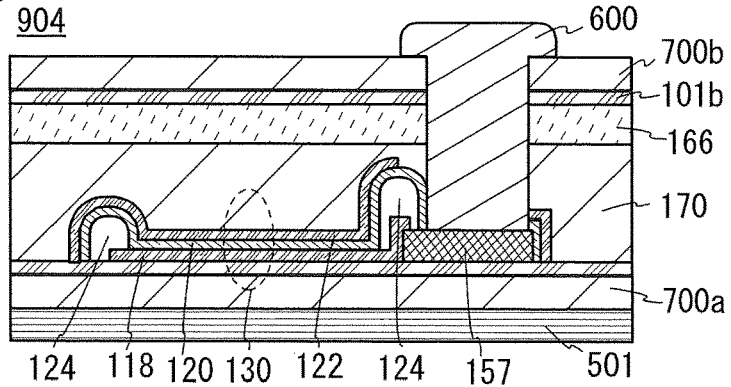

FIG. 1D is a cross-sectional view of a light-emitting device 904 which can be manufactured by a method for manufacturing a light-emitting device of one embodiment of the present invention. The light-emitting device 904 includes the flexible substrate 501 and the second organic layer 700b, and is thus flexible. In addition, in the light-emitting device 904, the coloring layer 166 is provided between the adhesive layer 170 and the second separation layer 101b. The other structures are the same as those of the light-emitting device 903.

The coloring layer 166 which is formed on the second substrate 100b may be bonded to the second electrode layer 122 with the adhesive layer 170 provided therebetween. Embodiment 1 can be referred to for the step.

The second substrate 100b is separated from the light-emitting device. Embodiment 1 can be referred to for the steps of separating the second substrate 100b from the light-emitting device and forming the second organic layer 700b.

Embodiment 1 can be referred to for the steps of separating the first substrate 100a from the light-emitting device, forming the first organic layer 700a, and providing the flexible substrate 501.

The method for manufacturing a light-emitting device of one embodiment of the present invention enables an opening to be formed in a resin or the like in which an opening is difficult to form in a region overlapping with the electrode terminal 157. The opening can be formed, without damage to the electrode terminal 157, in a resin or the like in which an opening is difficult to form.

The light-emitting device which is manufactured by the method for manufacturing a light-emitting device includes the flexible substrate 501 and the second organic layer 700b, and is thus flexible.

Light emitted from the light-emitting element can come out through the coloring layer from the light-emitting device manufactured by the method for manufacturing a light-emitting device; thus, a desired emission color can be obtained.

(Embodiment 2)

In this embodiment, a structure of a light-emitting device of one embodiment of the present invention will be described with reference to FIGS. 7A and 7B, and then a method for manufacturing the light-emitting device will be described with reference to FIGS. 8A to 8D, FIGS. 9A to 9C, FIGS. 10A and 10B, FIGS. 11A and 11B, and FIGS. 12A and 12B.

<Structure of Light-emitting Device>

Figure 7A:
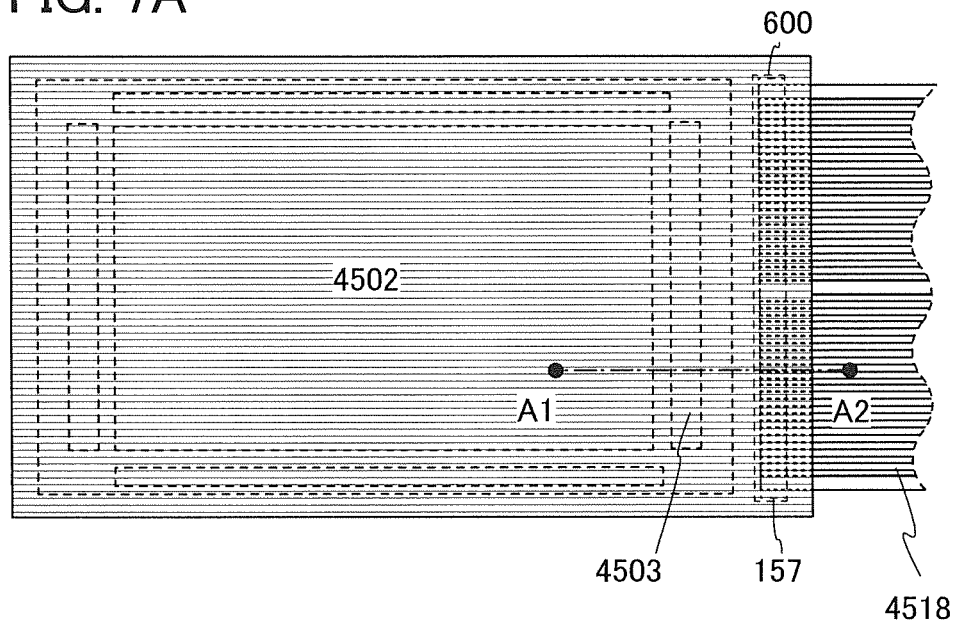
FIGS. 7A and 7B are a top view and a cross-sectional view of a light-emitting device of one embodiment of the present invention.
Figure 7B:
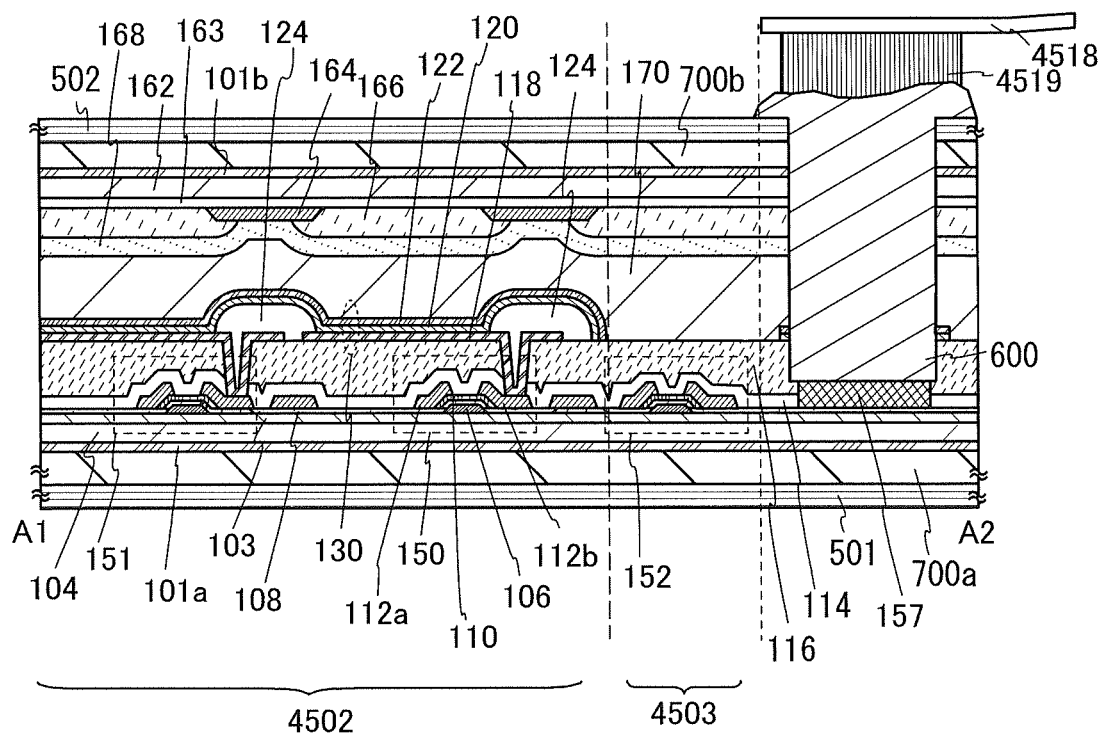

FIG. 7A is a top view illustrating a light-emitting device, and FIG. 7B is a cross-sectional view taken along the chain line A1-A2 in FIG. 7A.

In the light-emitting device illustrated in FIG. 7A, a pixel portion 4502 and a signal line circuit portion 4503 are provided over the flexible substrate 501.

A transistor 150 which controls the driving of a light-emitting element is provided in each pixel. In FIG. 7B, a transistor 152 which functions as part of the signal line circuit portion 4503 is illustrated.

The light-emitting device illustrated in FIG. 7B has a structure in which the flexible substrate 501 and a flexible substrate 502 are bonded together by the adhesive layer 170. Above the flexible substrate 501, the transistor 150, the light-emitting element 130 over the transistor 150, the partition wall 124 between the pixels, and the electrode terminal 157 are formed. A light-shielding film 164 and the coloring layer 166 are formed on the flexible substrate 502.

The light-emitting device illustrated in FIG. 7B has a top emission structure in which light emitted from the light-emitting element 130 comes out from the flexible substrate 502 side through the coloring layer 166.

The following are provided over the flexible substrate 501: a first organic layer 700a, a first buffer layer 104 which is over the first organic layer 700a, a transistor 150 which is over the first buffer layer 104 and controls the driving of the light-emitting element, the light-emitting element 130 electrically connected to the transistor 150, and the partition wall 124 between the light-emitting elements 130.

The transistor 150 includes a gate electrode layer 106 over the first buffer layer 104, a gate insulating layer 108 over the gate electrode layer 106, a semiconductor layer 110 over the gate insulating layer 108, and a source electrode layer 112a and a drain electrode layer 112b over the semiconductor layer 110. Further, the transistor 150 is covered with a first insulating layer 114 and a second insulating layer 116. The first electrode layer 118 is formed over the second insulating layer 116, the organic compound-containing layer 120 is formed over the first electrode layer 118, and the second electrode layer 122 is formed over the organic compound-containing layer 120.

The transistors 151 and 152 illustrated in FIG. 7B each have the same structure as the transistor 150. However, the size (e.g., channel length and channel width) of each transistor and connection between the transistors, and the like can be adjusted as appropriate.

The light-emitting element 130 consists of the first electrode layer 118, the organic compound-containing layer 120, and the second electrode layer 122. Further, the light-emitting element 130 is electrically connected to the transistor 150 through an opening provided in the first insulating layer 114 and the second insulating layer 116. The electrode terminal 157 is prevented from being covered with the second insulating layer 116 so that the organic compound-containing layer 120 is formed on a surface of the electrode terminal 157.

The organic compound-containing layer 120 and the second electrode layer 122 are formed in contact with a top surface of the electrode terminal 157 so that separation is performed at an interface between the electrode terminal 157 and the organic compound-containing layer 120 to remove part of the adhesive layer 170.

Further, the light-emitting elements 130 are separated by the partition wall 124, so that pixels including the separated light-emitting elements 130 are formed.

The partition wall 124 is provided in order to prevent the breakage of a film formed over the first electrode layer 118, the first insulating layer 114, and the second insulating layer 116 due to a step of an opening formed in the first electrode layer 118, the first insulating layer 114, and the second insulating layer 116. Thus, it is preferable that the partition wall 124 have a forward tapered shape so that a film formed over the partition wall 124 is prevented from being broken. In a forward tapered shape, a layer gradually increases in thickness and is in contact with a layer serving as a base.

Here, a method for manufacturing the light-emitting device illustrated in FIG. 7B is described in detail with reference to FIGS. 8A to 8D, FIGS. 9A to 9C, FIGS. 10A and 10B, FIGS. 11A and 11B, and FIGS. 12A and 12B.

<Method for Manufacturing Light-emitting Device>

First, the first separation layer 101a is formed over the first substrate 100a, and the first buffer layer 104 is formed over the first separation layer 101a. It is preferable that the first buffer layer 104 be formed successively so that the first separation layer 101a is not exposed to the air. The successive formation prevents dust or impurities from entering a portion between the first separation layer 101a and the first buffer layer 104.

The first substrate 100a may be a glass substrate, a quartz substrate, a sapphire substrate, a ceramic substrate, a metal substrate, or the like. Embodiment 1 can be referred to for the detail.

The first separation layer 101a has a single-layer structure or a stacked-layer structure containing an element selected from tungsten, molybdenum, titanium, tantalum, niobium, nickel, cobalt, zirconium, ruthenium, rhodium, palladium, osmium, iridium, or silicon, an alloy material containing any of the elements, or a compound material containing any of the elements. A crystal structure of a layer containing silicon may be amorphous, microcrystal, or polycrystal. Embodiment 1 can be referred to for the detail.

Next, the first buffer layer 104 is formed over the first separation layer 101a. The first buffer layer 104 is preferably formed using a single layer or stacked layers of a silicon nitride layer, a silicon oxynitride layer, a silicon nitride oxide layer, or the like.

The first buffer layer 104 can be formed by a sputtering method, a plasma CVD method, a coating method, a printing method, or the like. For example, the first buffer layer 104 is formed at a temperature of higher than or equal to 250° C. and lower than or equal to 400° C. by a plasma CVD method, whereby a dense film having very low water permeability can be obtained. Note that the thickness of the first buffer layer 104 is preferably greater than or equal to 10 nm and less than or equal to 3000 nm, further preferably greater than or equal to 200 nm and less than or equal to 1500 nm.

Figure 8A:
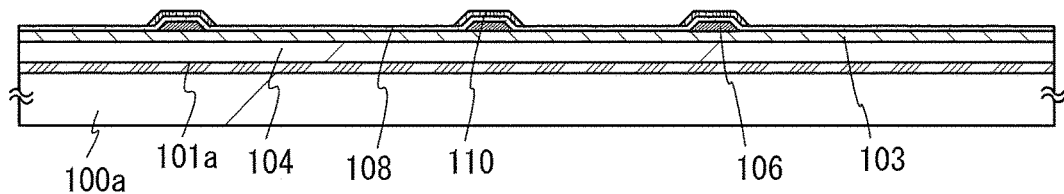
FIGS. 8A to 8D are cross-sectional views illustrating a method for manufacturing a light-emitting device of one embodiment of the present invention.

Next, a conductive film is formed over the first buffer layer 104 and an insulating layer 103 and then subjected to photolithography, whereby the gate electrode layer 106 is formed (FIG. 8A).

The gate electrode layer 106 can be formed using a single layer or stacked layers of a metal material such as molybdenum, titanium, chromium, tantalum, tungsten, aluminum, copper, neodymium, or scandium, or an alloy material containing any of the elements.

Next, the gate insulating layer 108 is formed over the gate electrode layer 106. The gate insulating layer 108 can be formed using a single layer or stacked layers of silicon oxide, silicon nitride, silicon oxynitride, silicon nitride oxide, or aluminum oxide by a plasma CVD method, a sputtering method, or the like. For example, a silicon oxynitride film may be formed using a deposition gas containing $SiH_4$ and $N_2O$ by a plasma CVD method.

Next, a semiconductor layer is formed and then subjected to photolithography, whereby an island-shaped semiconductor layer 110 is formed (FIG. 8A).

The semiconductor layer 110 can be formed using a silicon semiconductor or an oxide semiconductor. As a silicon semiconductor, single crystal silicon, polycrystalline silicon, or the like can be used as appropriate. As an oxide semiconductor, an In—Ga—Zn-based metal oxide or the like can be used as appropriate. Note that the semiconductor layer 110 is preferably formed using an oxide semiconductor which is an In—Ga—Zn-based metal oxide so as to have low off-state current, in which case the off-state leakage current of the light-emitting element to be formed later can be reduced. An oxide semiconductor which can be used in the present invention will be described in Embodiment 4.

Next, a conductive film is formed over the gate insulating layer 108 and the semiconductor layer 110 and then subjected to photolithography, whereby a source electrode layer 112a and a drain electrode layer 112b are formed.

As the conductive film used for the source electrode layer 112a and the drain electrode layer 112b, for example, a metal film containing an element selected from Al, Cr, Cu, Ta, Ti, Mo, or W, a metal nitride film containing any of these elements (e.g., a titanium nitride film, a molybdenum nitride film, or a tungsten nitride film), or the like can be used. Alternatively, a film of a high-melting-point metal such as Ti, Mo, or W or a metal nitride film of any of these elements (a titanium nitride film, a molybdenum nitride film, or a tungsten nitride film) may be stacked on one of or both a bottom side and a top side of a metal film of Al, Cu, or the like. Further alternatively, the conductive film for the source electrode layer 112a and the drain electrode layer 112b may be formed using a conductive metal oxide. As the conductive metal oxide, indium oxide ($In_2O_3$ or the like), tin oxide ($SnO_2$ or the like), zinc oxide (ZnO), ITO, indium oxide-zinc oxide ($In_2O_3$—ZnO or the like), or any of these metal oxide materials in which silicon oxide is contained can be used.

Next, the electrode terminal 157 is formed. The electrode terminal 157 may be formed of a conductive film. The electrode terminal 157 may be formed at the same time as the formation of the source electrode layer 112a and the drain electrode layer 112b.

Figure 8B:
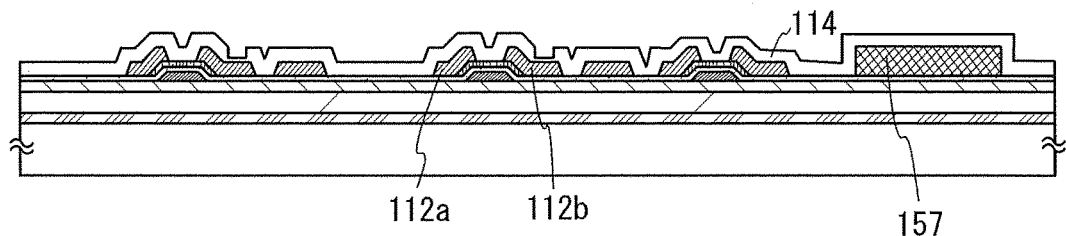

Next, the first insulating layer 114 is formed over the semiconductor layer 110, the source electrode layer 112a, and the drain electrode layer 112b (FIG. 8B). As the first insulating layer 114, an inorganic insulating film such as a silicon oxide film, a silicon oxynitride film, or an aluminum oxide film can be used.

Next, the second insulating layer 116 is formed over the first insulating layer 114.

As the second insulating layer 116, an insulating film with a planarization function is preferably selected in order to reduce surface unevenness due to the transistor. For example, an organic material such as a polyimide resin, or an acrylic resin can be used. Other than such organic materials, it is also possible to use a low-dielectric constant material (low-k material) or the like. Note that the second insulating layer 116 may be formed by stacking a plurality of insulating films formed using any of these materials.

Next, an opening reaching the electrode terminal 157 and an opening reaching the drain electrode layer 112b are formed in the first insulating layer 114 and the second insulating layer 116 by photolithography. As a method for forming the opening, a dry etching method, a wet etching method, or the like may be selected as appropriate.

Then, a conductive film is formed over the second insulating layer 116 and the drain electrode layer 112b and a photolithography step is performed on the conductive film, whereby the first electrode layer 118 is formed.

The first electrode layer 118 is preferably formed using a material which efficiently reflects light emitted from the organic compound-containing layer 120 (to be formed later). Embodiment 1 can be referred to for the detail.

Figure 8C:
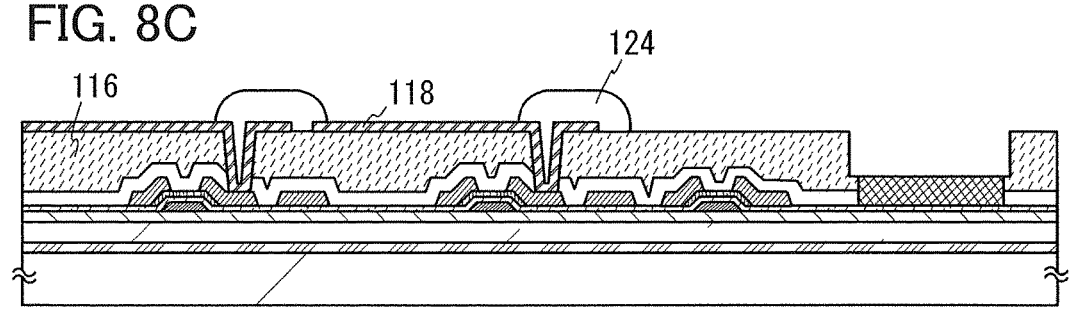

Next, the partition wall 124 is formed over the first electrode layer 118 (FIG. 8C).

The partition wall 124 is formed using an organic insulating material or an inorganic insulating material. It is particularly preferable that the partition wall 124 be formed using a photosensitive resin material to have an opening so that the sidewall of the partition wall 124 has an inclined surface with continuous curvature.

The organic compound-containing layer 120 is formed in contact with the electrode terminal 157, the first electrode layer 118, and the partition wall 124. The reason for forming the organic compound-containing layer 120 over the electrode terminal 157 is that the adhesive layer 170 over the electrode terminal 157 can be easily separated. Embodiment 1 and Embodiment 2 can be referred to for the materials which can be used for the organic compound-containing layer 120 and the second electrode layer 122.

Note that although the structure in which light from the organic compound-containing layer 120 passes through the coloring layer 166 in this embodiment, the present invention is not limited thereto. The organic compound-containing layers 120 may be separately deposited in different colors (e.g., R, G, and B), which makes the coloring layer 166 unnecessary. However, the number of steps and the cost might be increased by separately depositing the organic compound-containing layers 120 in different colors. The structure in which the coloring layer 166 and the organic compound-containing layer 120 which emits white light are formed, which is described in this embodiment, is preferably employed.

Figure 8D:
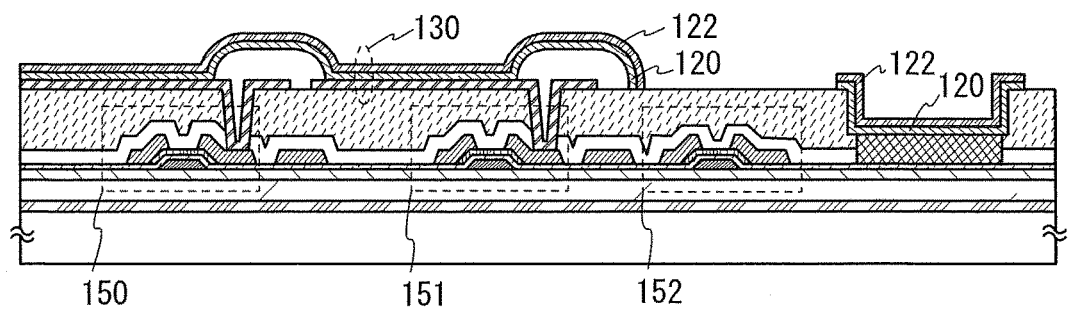

Next, the second electrode layer 122 is formed over the organic compound-containing layer 120 (FIG. 8D). The second electrode layer 122 may also be formed over the electrode terminal 157.

The second electrode layer 122 can be formed using a light-transmitting metal oxide. Embodiment 1 can be referred to for the materials which can be used for the second electrode layer 122.

Note that one of the first electrode layer 118 and the second electrode layer 122 functions as an anode of the light-emitting element 130, and the other functions as a cathode of the light-emitting element 130. It is preferable to use a substance having a high work function for the electrode which functions as the anode and a substance having a low work function for the electrode which functions as the cathode.

The light-emitting element 130 consists of the first electrode layer 118, the organic compound-containing layer 120, and the second electrode layer 122.

Through the above steps, the transistors 150 and 151 which control the driving of the light-emitting elements, and the light-emitting element 130 are formed over the first substrate 100a.

Next, a method for forming the light-shielding film 164, the coloring layer 166, and the overcoat layer 168 over the second substrate 100b will be described.

Figure 9A:
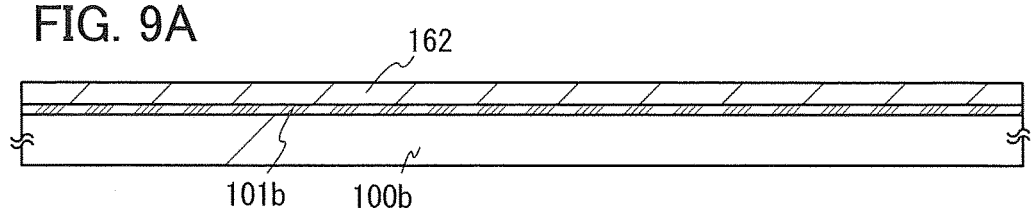
FIGS. 9A to 9C are cross-sectional views illustrating the method for manufacturing a light-emitting device of one embodiment of the present invention.

First, a second separation layer 101b is formed over the second substrate 100b and then a second buffer layer 162 is formed over the second separation layer 101b (see FIG. 9A).

The second separation layer 101b and the second buffer layer 162 can be formed using a material and a method similar to the above-described material and method for the first separation layer 101a and the first buffer layer 104.

Figure 9B:
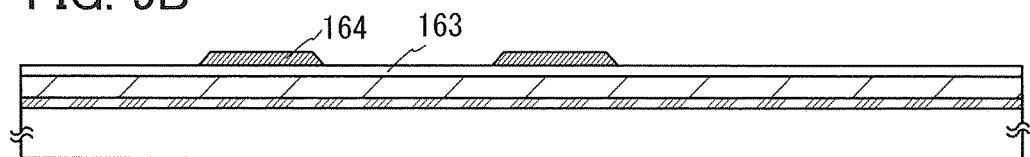

Then, a passivation layer 163 and a conductive film are formed over the second buffer layer 162, and the conductive film is processed by photolithography, whereby the light shielding film 164 is formed (see FIG. 9B).

The light-shielding film 164 can prevent mixture of colors of adjacent pixels. As the light-shielding film 164, a metal film with low reflectance, such as a titanium film or a chromium film, or an organic resin film impregnated with a black pigment or a black dye, can be used.

Next, the coloring layer 166 is formed over the passivation layer 163 and the light-shielding film 164.

The coloring layer 166 is a colored layer which transmits light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used. Each color filter is formed in a desired position using a known material by a printing method, an inkjet method, an etching method using photolithography, or the like.

Although the method of using three colors of R, G, and B is described here, the present invention is not limited thereto. A structure in which four colors of R, G, B, and Y (yellow) are used or a structure in which five or more colors are used may be also be employed.

Figure 9C:
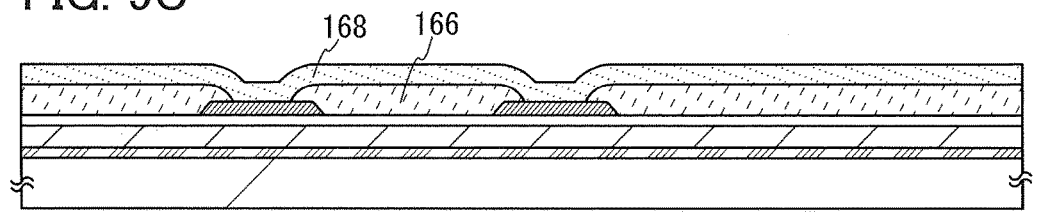

Next, the overcoat layer 168 is formed over the light-shielding film 164 and the coloring layer 166 (see FIG. 9C).

The overcoat layer 168 can be formed using an organic resin film formed of an acrylic resin, a polyimide resin, or the like. The overcoat layer 168 can prevent impurity components or the like contained in the coloring layer 166 from diffusing to the organic compound-containing layer 120 side. The overcoat layer 168 may have a stacked-layer structure of an organic resin film and an inorganic insulating film. Silicon nitride, silicon oxide, or the like can be used for the inorganic insulating film. Note that the overcoat layer 168 is not necessarily provided.

In the case where a resin used for the adhesive layer 170 is applied to the second substrate 100b in a later step of forming the adhesive layer 170, a material which has high wettability with respect to the resin is preferably used for the overcoat layer 168. In particular, the material used for the overcoat layer 168 needs to have characteristics such as high transmittance, no reaction when in contact with the resin, and insolubility in a solvent used for applying the resin. For example, an oxide conductive film such as an ITO film or a metal film such as an Ag film which is thin enough to transmit light is preferably used as the overcoat layer 168.

Through the above steps, the second separation layer 101b, the second buffer layer 162, the passivation layer 163, the light-shielding film 164, the coloring layer 166, and the overcoat layer 168 can be formed over the second substrate 100b. Note that in this embodiment, the coloring layer 166 is formed over the second substrate 100b; thus, the degree of accuracy of bonding the second substrate 100b to the first substrate 100a, which is described below, can be lower than or equal to 10 ppm, preferably lower than or equal to 5 ppm.

Figure 10A:
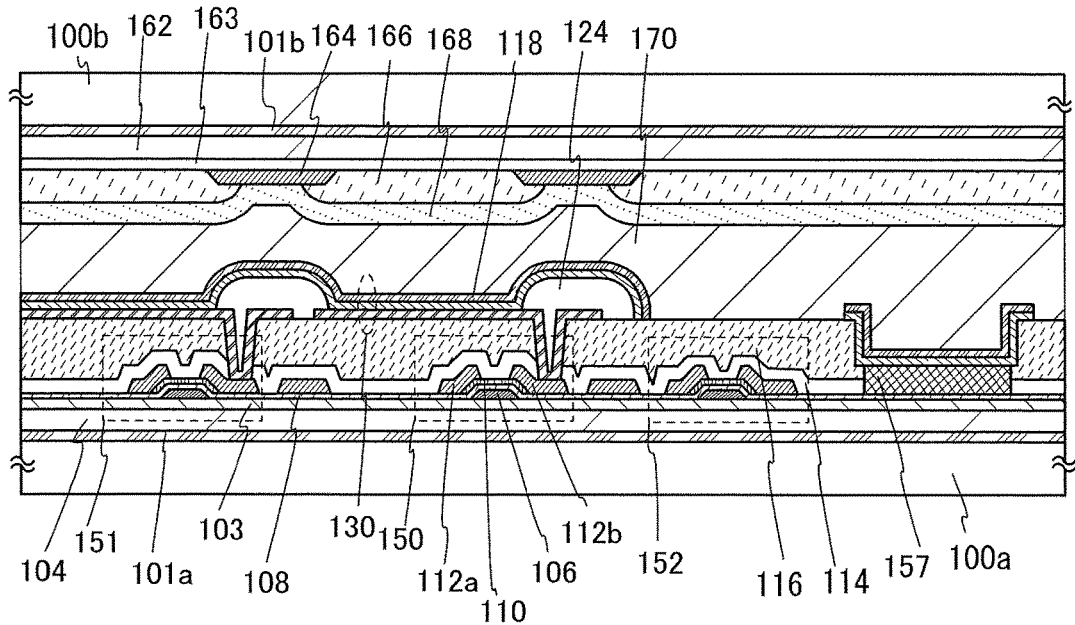
FIGS. 10A and 10B are cross-sectional views illustrating the method for manufacturing a light-emitting device of one embodiment of the present invention.

Next, the first substrate 100a and the second substrate 100b are aligned, and the first substrate 100a and the second substrate 100b are bonded together by the adhesive layer 170 (FIG. 10A).

Embodiment 1 can be referred to for the material which can be used for the adhesive layer 170.

Further, a sealing film with low moisture permeability may be formed between the adhesive layer 170 and the second electrode layer 122. As the sealing film with low moisture permeability, for example, silicon oxide, silicon nitride, aluminum oxide, or the like can be used.

Figure 10B:
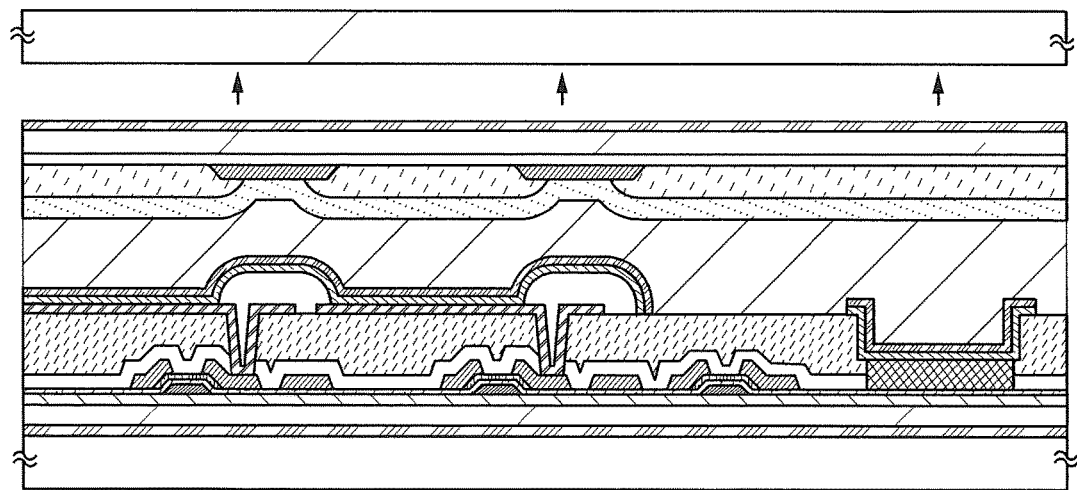

Next, separation is performed between the second substrate 100b and the second separation layer 101b which has been formed on the second substrate 100b (FIG. 10B). Any of a variety of methods can be employed for the separation method.

The size of the first separation layer 101a formed over the first substrate 100a and the size of the second separation layer 101b formed over the second substrate 100b may be different in a plane direction. For example, the second separation layer 101b is preferably formed smaller than the first separation layer 101a, in which case a groove is easily formed in the second separation layer 101b after the first substrate 100a and the second substrate 100b are bonded together.

As a separation method, mechanical force (a separation process with a human hand or with a gripper, a separation process by rotation of a roller, ultrasonic waves, or the like) may be used. Alternatively, the second buffer layer 162 may be separated from the second separation layer 101b in such a manner that liquid is dropped into the groove to allow the liquid to be infiltrated into the interface between the second separation layer 101b and the second buffer layer 162. Further alternatively, a method may be used in which a fluoride gas such as $NF_3$, $BrF_3$, or $ClF_3$ is introduced into the groove and the second separation layer 101b is removed by etching with the use of the fluoride gas so that the second buffer layer 162 is separated from the second substrate 100b having an insulating surface.

Alternatively, the following separation method can be employed, for example: the second separation layer 101b is formed using a metal (e.g., tungsten, molybdenum, or titanium) or an alloy containing the metal which is easily oxidized, the second buffer layer 162 is formed using an oxide (e.g., silicon oxide), and then heat treatment is performed to form a metal oxide layer at an interface between the second separation layer 101b and the second buffer layer 162, whereby the second separation layer 101b and the second buffer layer 162 can be separated from each other at the metal oxide layer. At this time, the metal oxide layer might remain on one or both of the surfaces of the second separation layer 101b and the second buffer layer 162 which have been subjected to the separation. In addition, part of the second separation layer 101b might remain on the second buffer layer 162. Here, the metal oxide layer may be formed on the surface of the second separation layer 101b in such a manner that oxidation treatment such as thermal oxidation or plasma oxidation is performed on a surface of the second separation layer 101b before the second buffer layer 162 is formed.

The second separation layer 101b and the second buffer layer 162 may be separated from each other in the above manner. In such a case, the second separation layer 101b is separated together with the second substrate 100b from the second buffer layer 162; thus, the second separation layer 101b does not remain in the light-emitting device to be manufactured.

As another separation method, in the case where the second separation layer 101b is formed using tungsten, separation can be performed while the second separation layer 101b is etched by a mixed solution of ammonia water and hydrogen peroxide water.

When a film containing nitrogen, oxygen, hydrogen, or the like (e.g., an amorphous silicon film containing hydrogen, a hydrogen-containing alloy film, or an oxygen-containing alloy film) is used as the second separation layer 101b and a substrate having a light-transmitting property is used as the second substrate 100b, the following method can be employed: the second separation layer 101b is irradiated with laser light through the second substrate 100b, and nitrogen, oxygen, or hydrogen contained in the separation layer is evaporated, so that separation can occur between the second substrate 100b and the second separation layer 101b.

Next, the flexible substrate 502 is bonded to the second buffer layer 162 (FIG. 11A) by the second organic layer 700b.

As the flexible substrate 502, a substrate which has flexibility and transmits visible light can be used. A substrate which has a touch panel function may also be used as the flexible substrate 502. For example, a light-transmitting conductive film may be formed on one of the surfaces of the flexible substrate 502. Although a variety of methods can be employed as a detection method of the touch panel, a projected capacitive touch technology is preferable. The flexible substrate 502 has the touch panel function, so that the light-emitting device can be thin.

The light-emitting device described in this embodiment is a top emission light-emitting device in which light comes out from the flexible substrate 502 side; thus, a non-light-transmitting metal substrate which is made thin enough to have a non-light-transmitting property may be used as the first substrate 100a. The metal substrate is provided on the side from which light does not come out. There is no particular limitation on the material for forming the metal substrate; however, aluminum, copper, nickel, an alloy of a metal such as an aluminum alloy or stainless steel, or the like can be preferably used.

In the case where a fibrous body is contained in the material for the flexible substrate 502, a high-strength fiber of an organic compound or an inorganic compound is used as the fibrous body. The high-strength fiber is specifically a fiber with a high tensile modulus of elasticity or a fiber with a high Young's modulus. Typical examples thereof include a polyvinyl alcohol based fiber, a polyester based fiber, a polyamide based fiber, a polyethylene based fiber, an aramid based fiber, a polyparaphenylene benzobisoxazole fiber, a glass fiber, and a carbon fiber. As an example of the glass fiber, a glass fiber using E glass, S glass, D glass, Q glass, or the like can be given. These fibers may be used in a state of a woven fabric or a nonwoven fabric, and a structure body in which this fibrous body is impregnated with an organic resin and the organic resin is cured may be used as the flexible substrate 502. The structure body including the fibrous body and the organic resin is preferably used as the flexible substrate 502, in which case reliability against bending or breaking due to local pressure can be increased.

As the second organic layer 700b, various curable adhesives, for example, a light curable adhesive such as a UV curable adhesive, a reactive curable adhesive, a thermal curable adhesive, and an anaerobic adhesive can be used. As the material of the adhesive, an epoxy resin, an acrylic resin, a silicone resin, a phenol resin, or the like can be used.

Note that in the case where a prepreg is used as the flexible substrate 502, the flexible substrate 502 and the second buffer layer 162 may be bonded together by applying pressure without using the second organic layer 700b.

Figure 11A:
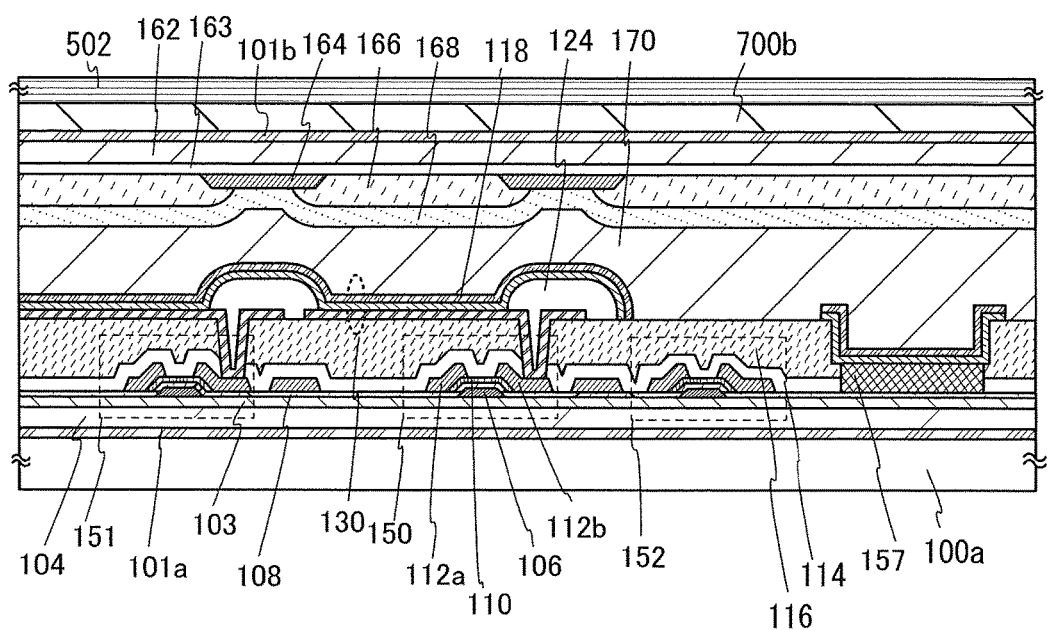
FIGS. 11A and 11B are cross-sectional views illustrating the method for manufacturing a light-emitting device of one embodiment of the present invention.
Figure 11B:
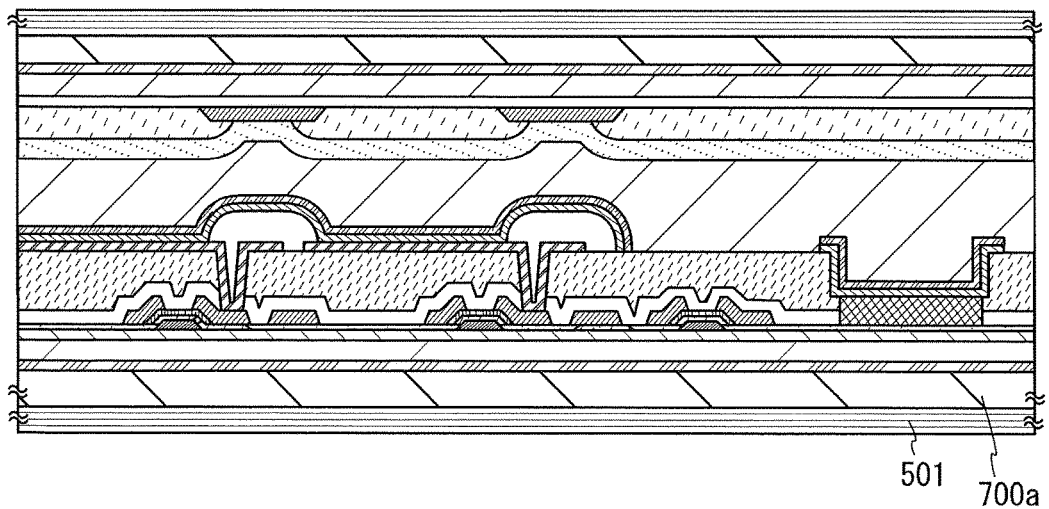

Next, the first substrate 100a and the first separation layer 101a formed over the first substrate 100a were separated from each other, and the flexible substrate 501 is bonded to the first separation layer 101a by the first organic layer 700a (FIG. 11B).

The separation can be performed by a method similar to the above method used for the separation between the second separation layer 101b and the second buffer layer 162 which are provided for the second substrate 100b. The flexible substrate 501 and the first organic layer 700a can be formed using materials and methods similar to those of the flexible substrate 502 and the second organic layer 700b, respectively.

Note that the first separation layer 101a and the first buffer layer 104 may be separated from each other in the above manner. In this case, the first separation layer 101a is separated together with the first substrate 100a from the first buffer layer 104, so that the first separation layer 101a does not remain in the light-emitting device to be manufactured.

Further, as described above, in the case where a metal or an alloy which is easily oxidized is used for the first separation layer 101a and separation is performed at a metal oxide layer which is obtained by oxidation of the metal or the alloy, the metal oxide layer might be attached to one or both of the surface of the first separation layer 101a and the first buffer layer 104.

In the case of a bottom emission light-emitting device in which light comes out from the flexible substrate 501 side, a substrate which has a touch panel function may be used as the flexible substrate 502.

Through the above steps, a light-emitting device formed over a flexible substrate can be manufactured.

The method in which the second substrate 100b is separated and then the first substrate 100a is separated is described as an example in this embodiment. However, the invention disclosed in this specification is not limited thereto, and the second substrate 100b may be separated after the separation of the first substrate 100a.

Further, the method in which the first substrate 100a is separated from the transistor 150 and the light-emitting element 130 which have been formed over the first substrate 100a, and then the transistor 150 and the light-emitting element 130 are transferred to the flexible substrate 501 is described as an example in this embodiment. However, the invention disclosed in this specification is not limited thereto, and the method may be employed in which the transistor 150, the light-emitting element 130, and the like are directly formed over the flexible substrate 501.

Figure 12A:
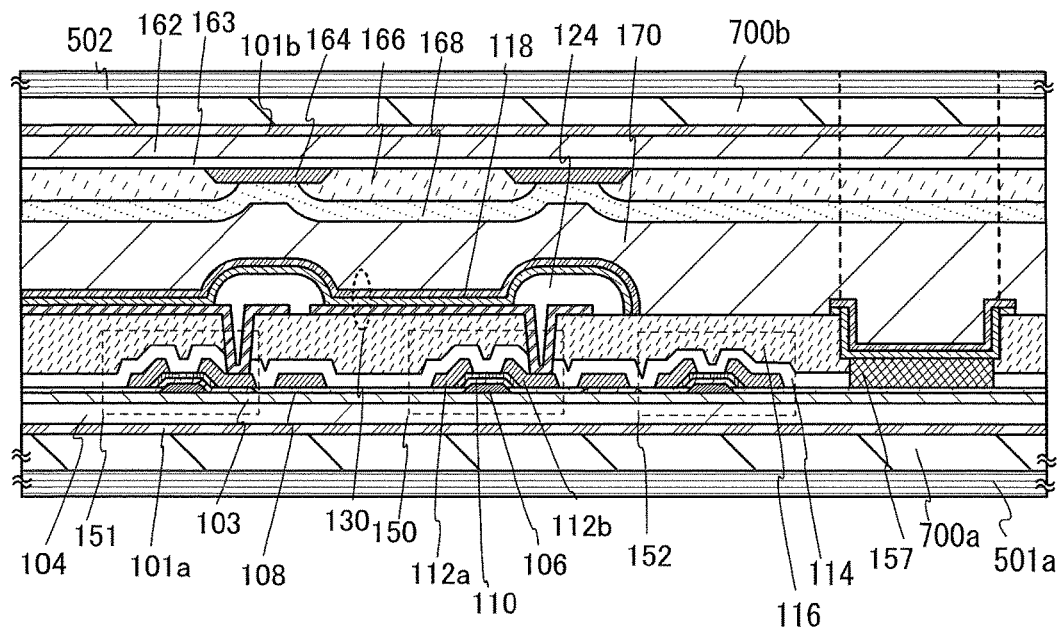
FIGS. 12A and 12B are cross-sectional views illustrating the method for manufacturing a light-emitting device of one embodiment of the present invention.

Next, a cut is made in the flexible substrate 502 and the second organic layer 700b from the flexible substrate 502 side so as to surround a portion overlapping with the electrode terminal 157 (FIG. 12A).

Figure 12B:
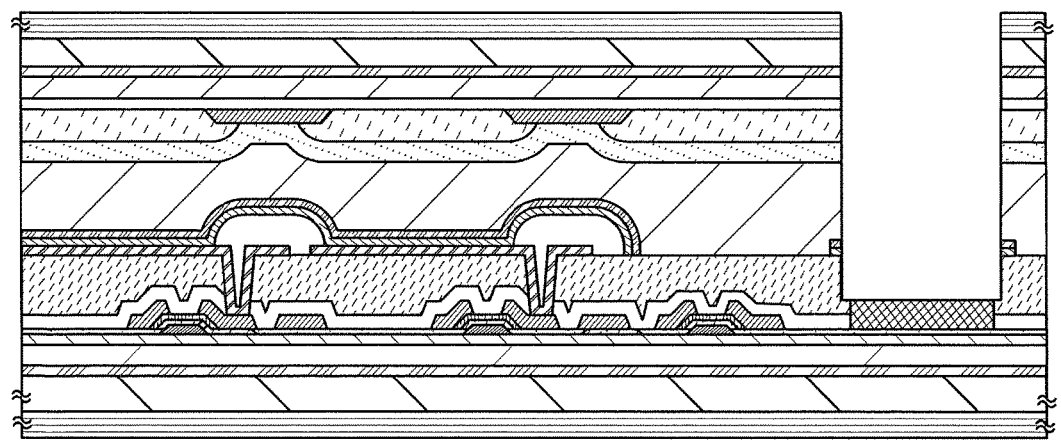

Next, part of the second organic layer 700b in which the cut is made so as to surround the portion overlapping with the electrode terminal 157 may be pulled in the direction in which the second organic layer 700b is separated from the light-emitting device. An interface between the organic compound-containing layer 120 and the electrode terminal 157 has low adhesion, and for this reason, the electrode terminal 157 can be exposed (FIG. 12B).

Next, the opening formed through the above steps is filled with the conductive layer 600. The conductive layer 600 is preferably formed using a silver paste or the like. The conductive layer 600 is electrically connected to a terminal including the FPC 4518 through an anisotropic conductive film 4519, whereby electric power supplied from an external power supply and an external signal can be input to the transistor or the like in the light-emitting device. Alternatively, the following method may be employed: instead of using the anisotropic conductive film 4519, the conductive layer 600 is formed of an anisotropic conductive film or an anisotropic conductive paste, the FPC 4518 is provided thereover, and then the FPC 4518 and the electrode terminal 157 are electrically connected to each other through the conductive layer 600 by thermocompression bonding. Further alternatively, an IC chip may be mounted, instead of the FPC, directly onto the conductive layer 600.

Although an active matrix light-emitting device is described as an example of a light-emitting device in this embodiment, the present invention can also be applied to a passive matrix light-emitting device.

As described above, in the light-emitting device described in this embodiment, the organic compound-containing layer 120 and the second electrode layer 122 are formed in contact with the electrode terminal 157. Since the interface between the organic compound-containing layer 120 and the electrode terminal 157 has low adhesion, an opening can be formed by separating parts of the adhesive layer 170, the second organic layer, and the flexible substrate, which overlap with the electrode terminal 157.

Figure 16:
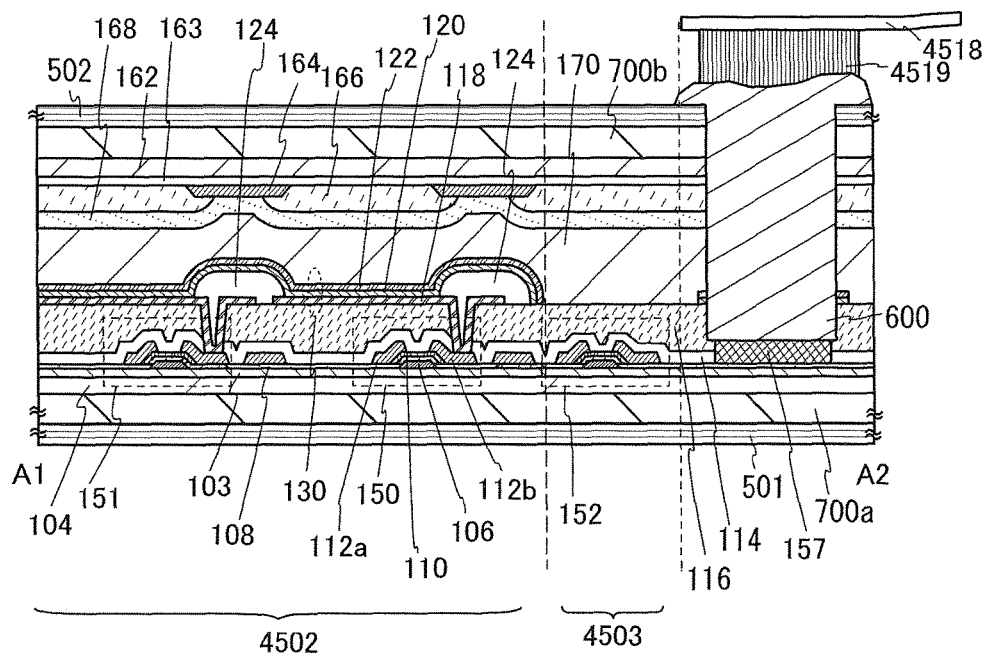
FIG. 16 is a cross-sectional view of a light-emitting device of one embodiment of the present invention.

Here, as described above, in the case where separation is performed between the separation layer and the buffer layer for the separation between the first substrate 100a and the second substrate 100b, the separation layer does not remain in the light-emitting device to be manufactured as illustrated in FIG. 16. Note that FIG. 16 is a cross-sectional schematic view of a light-emitting device in which neither the first separation layer 101a nor the second separation layer 101b remains. When the separation layer does not remain on the side through which light emitted from the light-emitting element 130 passes, the efficiency of light extraction from the light-emitting device can be increased.

Note that in the case where the separation layer remains in the light-emitting device, a light-transmitting material is preferably used for the separation layer used on the side from which light emitted from the light-emitting element 130 comes out. Further, in the case where a metal film, an alloy film, or a semiconductor film is used as the separation layer, the separation layer is preferably formed thin enough to transmit light.

The method for manufacturing a light-emitting device of one embodiment of the present invention is preferable for the case where a plurality of light-emitting devices are manufactured at the same time over a large substrate, i.e., "obtaining multiple light-emitting devices". For example, large substrates with the same size are used as the first substrate 100a and the second substrate 100b, and a plurality of light-emitting devices are manufactured over a flexible substrate. After that, the plurality of light-emitting devices are separated and then the electrode terminal 157 can be exposed to be electrically connected to the FPC 4518.

For example, in the case of obtaining multiple light-emitting devices by a conventional method, the positions at which the flexible substrate 501 and the flexible substrate 502 are cut need to be different in order to expose the electrode terminal 157.

In this method, it is difficult to remove the flexible substrate 502 over the electrode terminal 157 because the flexible substrates 501 and 502 are bonded together by the adhesive layer 170. On the other hand, in the method for manufacturing a light-emitting device of one embodiment of the present invention, the positions at which the flexible substrate 501 and the flexible substrate 502 are cut are the same. This enables a large number of light-emitting devices to be manufactured at the same time with a high yield; that is, productivity can be improved.

Further, since the use of the first substrate 100a and the second substrate 100b having the same size eliminates the need for preparing substrates with different sizes, the same type of substrates or the same manufacturing apparatus (e.g., film-formation apparatus) can be used, which leads to an improvement in productivity. Moreover, the use of substrates having the same size suppresses a defect such as a crack which is caused by concentration of stress on a film included in the light-emitting device when the substrates are each separated.

This embodiment can be implemented in appropriate combination with any of the structures described in the other embodiments.

(Embodiment 3)
<Structure of Light-emitting Element>

Figure 13A:
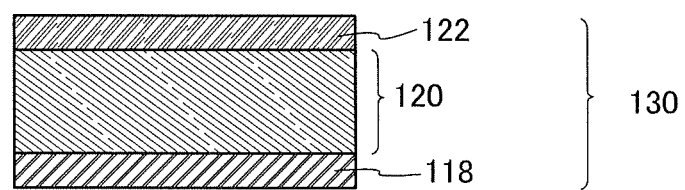
FIGS. 13A and 13B are each a cross-sectional view of a light-emitting element of one embodiment of the present invention.

The light-emitting element 130 illustrated in FIG. 13A has a structure in which the organic compound-containing layer 120 is sandwiched between a pair of electrodes (the first electrode layer 118 and the second electrode layer 122). Note that the first electrode layer 118 is used as an anode and the second electrode layer 122 is used as a cathode as an example in the following description of this embodiment.

The organic compound-containing layer 120 includes at least a light-emitting layer and may have a stacked-layer structure including a functional layer other than the light-emitting layer. Examples of the functional layer other than the light-emitting layer include a layer containing a substance having a high hole-injection property, a substance having a high hole-transport property, a substance having a high electron-transport property, a substance having a high electron-injection property, and a bipolar substance (a substance having high electron- and hole-transport properties). Specifically, functional layers such as a hole-injection layer, a hole-transport layer, an electron-transport layer, and an electron-injection layer can be used in combination as appropriate.

The light-emitting element 130 illustrated in FIG. 13A emits light when current flows because of a potential difference generated between the first electrode layer 118 and the second electrode layer 122, and holes and electrons are recombined in the organic compound-containing layer 120. That is, a light-emitting region is formed in the organic compound-containing layer 120.

In this invention, light emitted from the light-emitting element 130 comes out from the first electrode layer 118 side or the second electrode layer 122 side. Therefore, one or both of the first electrode layer 118 and the second electrode layer 122 are formed using a substance having a light-transmitting property.

Figure 13B:
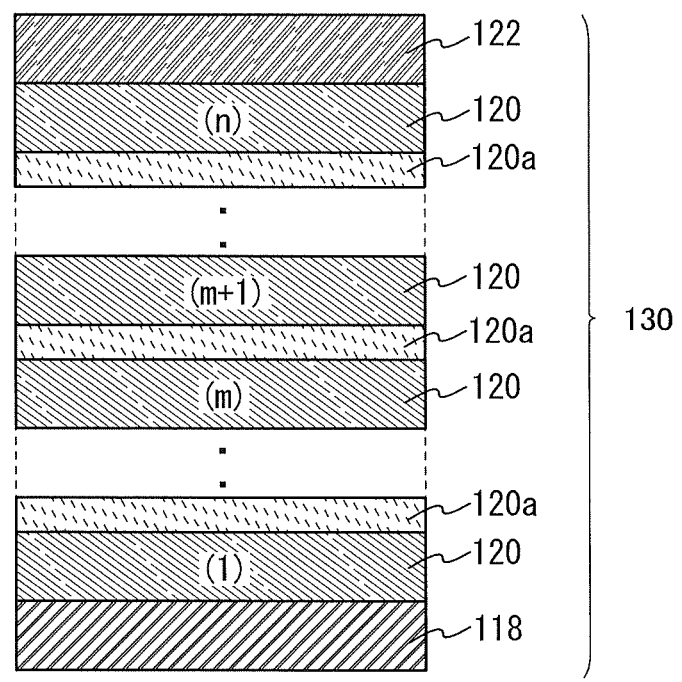

Note that a plurality of organic compound-containing layers 120 may be stacked between the first electrode layer 118 and the second electrode layer 122 as illustrated in FIG. 13B. In the case where n (n is a natural number of 2 or more) layers are stacked, a charge generation layer 120a is preferably provided between the m-th (m is a natural number of 1 or more and n−1 or less) organic compound-containing layer 120 and the (m+1)-th organic compound-containing layer 120.

The charge generation layer 120a may be formed using a composite material of an organic compound and a metal oxide, a metal oxide, or a composite material of an organic compound and an alkali metal, an alkaline earth metal, or a compound thereof; alternatively, these materials may be combined as appropriate. Examples of the composite material of an organic compound and a metal oxide include composite materials of an organic compound and a metal oxide such as vanadium oxide, molybdenum oxide, and tungsten oxide. As the organic compound, various compounds can be used; for example, a low molecular compounds such as an aromatic amine compound, a carbazole derivative, or aromatic hydrocarbon and a compound in which the basic skeleton is any of the low molecular compounds, such as oligomer, dendrimer, or polymer. An organic compound having a hole mobility of $1 \times 10^{-6}$ cm$^2$/Vs or higher is preferably used as a hole-transport organic compound. However, a substance other than these materials may also be used as long as the hole-transport property thereof is higher than the electron-transport property thereof. Since these materials used for the charge generation layer 120a have excellent carrier-injection property and carrier-transport property, the light-emitting element 130 can be driven with low current and with low voltage.

Note that the charge generating layer 120a may be formed using a combination of a composite material of an organic compound and a metal oxide with another material. For example, a layer containing a composite material of an organic compound and a metal oxide may be combined with a layer containing a compound of a substance selected from substances having an electron-donating property and a compound having a high electron-transport property. Moreover, a layer containing a composite material of an organic compound and a metal oxide may be combined with a transparent conductive film.

Such a structure of the light-emitting element 130 can make problems such as energy transfer and quenching unlikely to occur and can extend the range of choices of materials. The light-emitting element 130 having such a structure can easily have both high emission efficiency and a long lifetime. Moreover, phosphorescence and fluorescence can be obtained easily from one light-emitting layer and the other light-emitting layer, respectively.

Note that the charge generation layer 120a has a function of injecting holes to one of the organic compound-containing layers 120, which is formed in contact with the charge generation layer 120a, and a function of injecting electrons to the other of the organic compound-containing layers 120, when voltage is applied between the first electrode layer 118 and the second electrode layer 122.

The light-emitting element 130 illustrated in FIG. 13B can provide a variety of emission colors by changing the type of the light-emitting substance which is used for the organic compound-containing layer 120. In addition, a plurality of light-emitting substances of different colors are used as the light-emitting substance, whereby light emission having a broad spectrum or white light emission can also be obtained.

In the case where white light emission is obtained using the light-emitting element 130 illustrated in FIG. 13B, as for a combination of a plurality of organic compound-containing layers 120, a structure for emitting white light including red light, blue light, and green light may be used. For example, the structure may include a first light-emitting layer containing a blue fluorescent substance as a light-emitting substance and a second light-emitting layer containing green and red phosphorescent substances as light-emitting substances. Alternatively, a structure including a first light-emitting layer exhibiting red light, a second light-emitting layer exhibiting green light, and a third light-emitting layer exhibiting blue light may be employed. White light emission can be obtained also with a structure including light-emitting layers emitting light of complementary colors. In the case where light emitted from the first light-emitting layer and light emitted from the second light-emitting layer have complementary colors in a stacked-layer element including two light-emitting layers, the combination of colors are as follows: blue and yellow, blue-green and red, or the like.

In the structure of the above stacked-layer element, by providing the charge generation layer between the stacked light-emitting layers, the element can have a long lifetime in a high luminance region while keeping the current density low. In addition, a voltage drop due to the resistance of the electrode material can be reduced, whereby uniform light emission in a large area is possible.

This embodiment can be implemented in appropriate combination with any of the structures described in the other embodiments.

(Embodiment 4)

In this embodiment, an oxide semiconductor which can be used for the semiconductor layer in Embodiment 2 will be described in detail.

At least indium (In) or zinc (Zn) is preferably contained as an oxide semiconductor used for the semiconductor layer of the transistor. In particular, In and Zn are preferably contained. A stabilizer for strongly bonding oxygen is preferably contained in addition to In and Zn. As the stabilizer, at least one of gallium (Ga), tin (Sn), zirconium (Zr), hafnium (Hf), and aluminum (Al) may be contained.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, the following can be used, for example: an In—Sn—Ga—Zn-based oxide, an In—Ga—Zn-based oxide, an In—Sn—Zn-based oxide, an In—Zr—Zn-based oxide, an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, an In-based oxide, a Sn-based oxide, or a Zn-based oxide.

Note that here, for example, an "In—Ga—Zn-based oxide" refers to an oxide mainly containing In, Ga, and Zn, and there is no limitation on the ratio of In to Ga and Zn.

Alternatively, a material represented by $InMO_3(ZnO)_m$ (m>0) may be used as the oxide semiconductor. Note that M represents one or more metal elements selected from Ga, Fe, Mn, or Co. Still alternatively, a material represented by In$_2$SnO$_5$(ZnO)$_n$ (n>0 is satisfied, and n is an integer) may be used as an oxide semiconductor.

For example, an In—Ga—Zn-based oxide with an atomic ratio of In:Ga:Zn=3:1:2, 1:1:1, or 2:2:1, or an oxide whose atomic ratio is in the neighborhood of the above atomic ratios can be used. Alternatively, an In—Sn—Zn-based oxide with an atomic ratio of In:Sn:Zn=1:1:1, In:Sn:Zn=2:1:3, or In:Sn:Zn=2:1:5, or an oxide with an atomic ratio close to the above atomic ratios may be used.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy Formula (1).

$$(a-A)^2+(b-B)^2+(c-C)^2 \leq r^2 \qquad (1)$$

In the formula, r may be, for example, 0.05. The same applies to other oxides.

However, the composition of the oxide semiconductor is not limited to those described above, and an oxide semiconductor having an appropriate composition may be used depending on necessary semiconductor characteristics (e.g., field-effect mobility or threshold voltage). In order to obtain the required semiconductor characteristics, it is preferable that the carrier concentration, the impurity concentration, the defect density, the atomic ratio between a metal element and oxygen, the interatomic distance, the density, and the like be set to appropriate values.

When an oxide semiconductor is highly purified, the off-state current of a transistor using such an oxide semiconductor in a semiconductor layer can be sufficiently reduced (here, the off-state current means a drain current when a potential difference between a source and a gate is equal to or lower than the threshold voltage in the off state, for example). A highly purified oxide semiconductor can be obtained, for example, in such a manner that a film is deposited while heating is performed so as to prevent hydrogen and a hydroxyl group from being contained in the oxide semiconductor, or heat treatment is performed after film deposition so as to remove hydrogen and a hydroxyl group from the film. When an In—Ga—Zn-based oxide which is used for a channel region of a transistor is highly purified, the off-state current per channel width can be approximately from $1\times10^{-24}$ (1 yA/µm) to $1\times10^{-22}$ (100 yA/µm).

An oxide semiconductor film which can be used for a semiconductor layer may be in a non-single-crystal state, for example. The non-single-crystal state is, for example, structured by at least one of c-axis aligned crystal (CAAC), polycrystal, microcrystal, and an amorphous part. The density of defect states of an amorphous part is higher than those of microcrystal and CAAC. The density of defect states of microcrystal is higher than that of CAAC. Note that an oxide semiconductor including CAAC is referred to as a CAAC-OS (c-axis aligned crystalline oxide semiconductor).

The oxide semiconductor film is preferably a CAAC-OS film. In the CAAC-OS, for example, c-axes are aligned, and a-axes and/or b-axes are not macroscopically aligned.

For example, an oxide semiconductor film may include microcrystal. Note that an oxide semiconductor including microcrystal is referred to as a microcrystalline oxide semiconductor. A microcrystalline oxide semiconductor film includes microcrystal (also referred to as nanocrystal) with a size greater than or equal to 1 nm and less than 10 nm, for example.

For example, an oxide semiconductor film may include an amorphous part. Note that an oxide semiconductor including an amorphous part is referred to as an amorphous oxide semiconductor. An amorphous oxide semiconductor film, for example, has disordered atomic arrangement and no crystalline component. Alternatively, an amorphous oxide semiconductor film is, for example, absolutely amorphous and has no crystal part.

Note that an oxide semiconductor film may be a mixed film including any of a CAAC-OS, a microcrystalline oxide semiconductor, and an amorphous oxide semiconductor. The mixed film, for example, includes a region of an amorphous oxide semiconductor, a region of a microcrystalline oxide semiconductor, and a region of a CAAC-OS. Further, the mixed film may have a stacked structure including a region of an amorphous oxide semiconductor, a region of a microcrystalline oxide semiconductor, and a region of a CAAC-OS, for example.

Note that an oxide semiconductor film may be in a single-crystal state, for example.

An oxide semiconductor film preferably includes a plurality of crystal parts. In each of the crystal parts, a c-axis is preferably aligned in a direction parallel to a normal vector of a surface where the oxide semiconductor film is formed or a normal vector of a surface of the oxide semiconductor film. Note that, among crystal parts, the directions of the a-axis and the b-axis of one crystal part may be different from those of another crystal part. An example of such an oxide semiconductor film is a CAAC-OS film.

Note that in most cases, a crystal part in the CAAC-OS film fits inside a cube whose one side is less than 100 nm. In an image obtained with a transmission electron microscope (TEM), a boundary between crystal parts in the CAAC-OS film is not clearly detected. Further, with the TEM, a grain boundary in the CAAC-OS film is not clearly found. Thus, in the CAAC-OS film, a reduction in electron mobility due to the grain boundary is suppressed.

In each of the crystal parts included in the CAAC-OS film, for example, a c-axis is aligned in a direction parallel to a normal vector of a surface where the CAAC-OS film is formed or a normal vector of a surface of the CAAC-OS film. Further, in each of the crystal parts, atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that, among crystal parts, the directions of an a-axis and a b-axis of one crystal part may be different from those of another crystal part. In this specification, a term "perpendicular" includes a range from 80° to 100°, preferably from 85° to 95°. In addition, a term "parallel" includes a range from −10° to 10°, preferably from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, crystallinity of the crystal part in a region to which the impurity is added is lowered in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the film deposition is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-OS film is formed or a normal vector of the surface of the CAAC-OS film.

Further, the CAAC-OS can be formed, for example, by reducing the density of defect states. In an oxide semiconductor, oxygen vacancies for example form defect states. The oxygen vacancies form trap states or serve as carrier generation sources when hydrogen is captured therein. In order to form the CAAC-OS, for example, it is important to prevent oxygen vacancies from being generated in the oxide semiconductor. Thus, the CAAC-OS is an oxide semiconductor having a low density of defect states. In other words, the CAAC-OS is an oxide semiconductor having few oxygen vacancies.

The state in which impurity concentration is low and density of defect states is low (the number of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, in some cases, a transistor including the oxide semiconductor in a channel formation region rarely has a negative threshold voltage (normally-on characteristics). A highly purified intrinsic or substantially highly purified intrinsic oxide semiconductor has a low density of defect states and accordingly has a low density of trap states in some cases. Thus, the transistor including the oxide semiconductor in the channel formation region has a small variation in electrical characteristics and high reliability in some cases. Charges trapped by the trap states in the oxide semiconductor take a long time to be released and may behave like fixed charges. Thus, the transistor which includes the oxide semiconductor having a high density of trap states in the channel formation region has unstable electrical characteristics in some cases.

In a transistor using the CAAC-OS film, change in electric characteristics due to irradiation with visible light or ultraviolet light is small. Thus, the transistor has high reliability.

In the case where a CAAC-OS film is deposited by a sputtering method, a substrate temperature in the deposition is preferably high. For example, an oxide film is deposited at a substrate heating temperature from 100° C. to 600° C., preferably from 200° C. to 500° C., further preferably from 150° C. to 450° C., whereby a CAAC-OS film can be deposited.

Electric power used in a sputtering method is preferably supplied from a direct-current (DC) source. Note that a radio frequency (RF) power source or an alternating-current (AC) power source can be used. Note that it is difficult to use an RF power source for a sputtering apparatus which is capable of deposition to a large-sized substrate. In addition, a DC power source is preferred to an AC power source from the viewpoint below.

In the case where an In—Ga—Zn—O compound target is used as a sputtering target, an In—Ga—Zn—O compound target in which InOx powder, GaOy powder, and ZnOz powder are mixed in the molar ratio of 2:2:1, 8:4:3, 3:1:1, 1:1:1, 4:2:3, 3:1:2, 3:1:4, 1:6:4, 1:6:9 is preferably used, for example. Note that x, y, and z are each a given positive number. Note that a sputtering target may be polycrystalline.

Alternatively, with use of magnetron, plasma area near a sputtering target can be increased in density due to a magnetic field. For example, in a magnetron sputtering apparatus, a magnetic assembly is located in the back of the sputtering target and a magnetic field is generated in the front of the sputtering target. When sputtering to the sputtering target, the magnetic field traps ionized electrons and secondary electrons generated by the sputtering. The electrons trapped in this way enhance the odds of collision with an inert gas, such as a rare gas, in the deposition chamber, thereby increasing the plasma density. Thus, the deposition rate can be increased without significantly increasing the temperature of an element formation layer.

In the case where a CAAC-OS film is deposited by a sputtering method, for example, impurities (e.g., hydrogen, water, carbon dioxide, and nitrogen) existing in a deposition chamber of a sputtering apparatus is preferably reduced. Further, the concentration of impurities in a deposition gas is preferably reduced. For example, as a deposition gas such as an oxygen gas or an argon gas, a highly purified gas having a dew point of −40° C. or lower, preferably −80° C. or lower, still preferably −100° C. or lower is used, whereby suppressing entry of impurities into a CAAC-OS film.

In the case where a CAAC-OS film is deposited by a sputtering method, it is preferable to suppress plasma damage when the deposition is performed by increasing the oxygen percentage in the deposition gas and optimizing electric power. For example, the oxygen percentage in the deposition gas is preferably 30 vol % or higher, still preferably 100 vol %.

In the case where a CAAC-OS film is deposited by a sputtering method, heat treatment may be performed in addition to the substrate heating when the deposition is performed. By the heat treatment, the impurity concentration in the oxide semiconductor film can be reduced, for example.

The heat treatment is performed at higher than or equal to 350° C. and lower than a strain point of the substrate, or may be performed at higher than or equal to 350° C. and lower than or equal to 450° C. Note that the heat treatment may be performed more than once.

There is no particular limitation on a heat treatment apparatus to be used for the heat treatment, and a rapid thermal annealing (RTA) apparatus such as a gas rapid thermal annealing (GRTA) apparatus or a lamp rapid thermal annealing (LRTA) apparatus may be used. Alternatively, another heat treatment apparatus such as an electric furnace may be used.

As described in the above process, an impurity concentration in the oxide semiconductor film is reduced by preventing entry of hydrogen, water, or the like into the film during the deposition. The impurity concentration can be reduced by removing hydrogen, water, or the like contained in the oxide semiconductor film through the heat treatment after the deposition of the oxide semiconductor film. After that, oxygen is supplied to the oxide semiconductor film to repair oxygen defects, thereby highly purifying the oxide semiconductor film. Moreover, oxygen may be added to the oxide semiconductor film. The purified oxide semiconductor is an i-type (intrinsic) semiconductor or a substantially i-type semiconductor. The carrier density of the oxide semiconductor film which is substantially i-type is lower than $1\times10^{17}/cm^3$, lower than $1\times10^{15}/cm^3$, or lower than $1\times10^{13}/cm^3$.

The above is the description of the oxide semiconductor used for the semiconductor layer of the transistor.

(Embodiment 5)

In this embodiment, examples of an electronic appliance and a lighting device to which the light-emitting device of one embodiment of the present invention is applied will be described with reference to drawings.

As examples of electronic appliances with flexibility, the following can be given: television devices (also referred to as televisions or television receivers), monitors of computers or the like, cameras such as digital cameras or digital video cameras, digital photo frames, mobile phones (also referred to as mobile phones or mobile phone devices), portable game machines, portable information terminals, audio reproducing devices, large game machines such as pachinko machines, and, the like.

In addition, a lighting device or a display device can be incorporated along a curved inside/outside wall surface of a house or a building or a curved interior/exterior surface of a car.

Figure 14A:
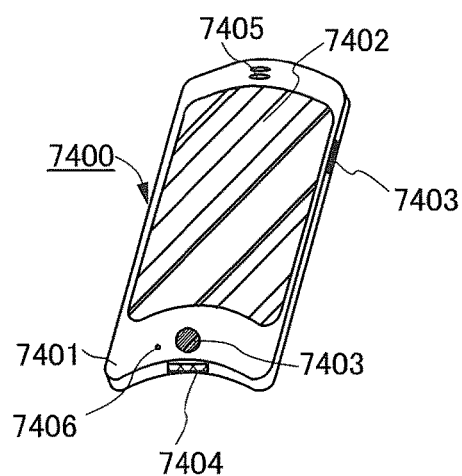
FIGS. 14A to 14E each illustrate an electronic appliance including a light-emitting device of one embodiment of the present invention.

FIG. 14A illustrates an example of a mobile phone. A mobile phone 7400 includes a display portion 7402 incorporated in a housing 7401, operation buttons 7403, an external connection port 7404, a speaker 7405, a microphone 7406, and the like. Note that the mobile phone 7400 is manufactured using a light-emitting device for the display portion 7402.

When the display portion 7402 of the mobile phone 7400 illustrated in FIG. 14A is touched with a finger or the like, data can be input to the mobile phone 7400. Further, operations such as making a call and inputting a letter can be performed by touch on the display portion 7402 with a finger or the like.

The power can be turned on or off by pressing the operation button 7403. In addition, types of images displayed on the display portion 7402 can be switched; for example, switching images from a mail creation screen to a main menu screen.

Here, the display portion 7402 includes the light-emitting device of one embodiment of the present invention. Thus, the mobile phone can have a curved display portion and high reliability.

Figure 14B:
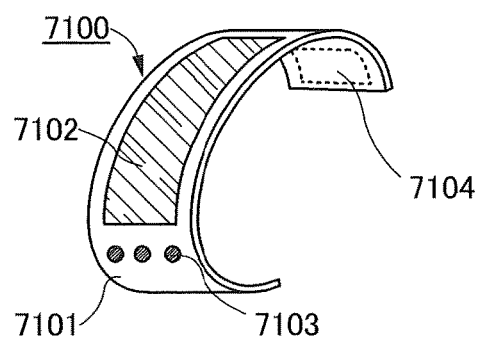

FIG. 14B is an example of a wristband-type portable display device. A portable display device 7100 includes a housing 7101, a display portion 7102, an operation button 7103, and a sending and receiving device 7104.

The portable display device 7100 can receive a video signal with the sending and receiving device 7104 and can display the received video on the display portion 7102. In addition, with the sending and receiving device 7104, the portable display device 7100 can send an audio signal to another receiving device.

Power ON/OFF, switching of displayed videos, adjusting volume, and the like can be performed by pressing the operation button 7103.

Here, the display portion 7102 includes the light-emitting device of one embodiment of the present invention. Thus, the mobile display device can have a curved display portion and high reliability.

Figure 14C:
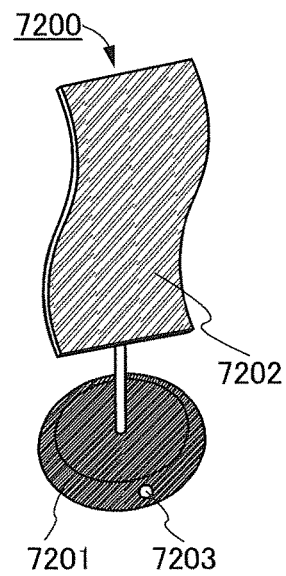
Figure 14D:
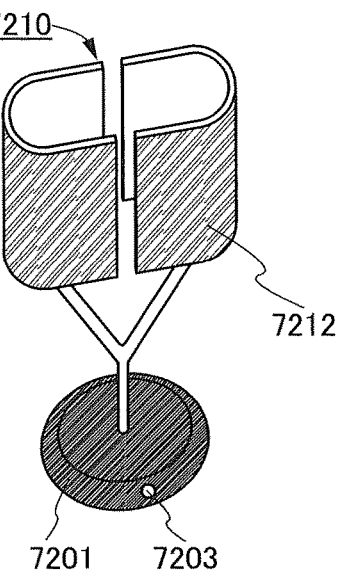
Figure 14E:
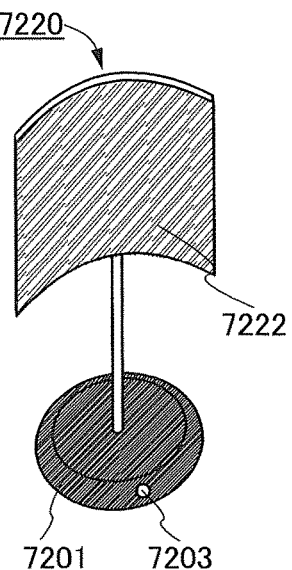

FIGS. 14C to 14E illustrate examples of lighting devices. Lighting devices 7200, 7210, and 7220 each include a stage 7201 provided with an operation switch 7203 and a light-emitting portion supported by the stage 7201.

The lighting device 7200 illustrated in FIG. 14C includes a light-emitting portion 7202 with a wave-shaped light-emitting surface, and thus has an elaborate design.

A light-emitting portion 7212 included in the lighting device 7210 illustrated in FIG. 14D has two convex-curved light-emitting portions symmetrically placed. Thus, light radiates from the lighting device 7210.

The lighting device 7220 illustrated in FIG. 14E includes a concave-curved light-emitting portion 7222. This is suitable for illuminating a specific range because light emitted from the light-emitting portion 7222 is collected to the front of the lighting device 7220.

The light-emitting portion included in each of the lighting devices 7200, 7210, and 7220 are flexible; thus, the light-emitting portion may be fixed on a plastic member, a movable frame, or the like so that an emission surface of the light-emitting portion can be bent freely depending on the intended use.

Here, the light-emitting portions 7202, 7212, and 7222 each include the light-emitting device of one embodiment of the present invention. Thus, the lighting devices can have curved light-emitting portions and high reliability.

Figure 15A:
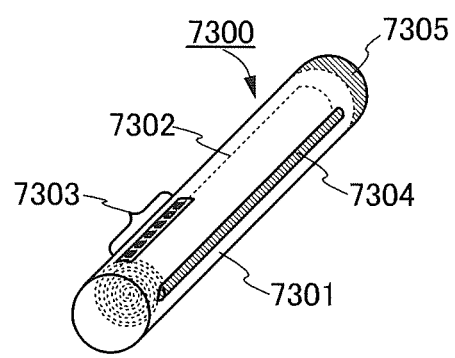
FIGS. 15A and 15B illustrate an electronic appliance including a light-emitting device of one embodiment of the present invention.

FIG. 15A illustrates an example of a portable display device. A display device 7300 includes a housing 7301, a display portion 7302, operation buttons 7303, a display portion pull 7304, and a control portion 7305.

The display device 7300 includes a rolled flexible display portion 7302 in the cylindrical housing 7301.

The display device 7300 can receive a video signal with the control portion 7305 and can display the received video on the display portion 7302. In addition, a battery is included in the control portion 7305. Moreover, a connector may be included in the control portion 7305 so that a video signal or power can be directly supplied.

By pressing the operation buttons 7303, power ON/OFF, switching of displayed videos, and the like can be performed.

Figure 15B:
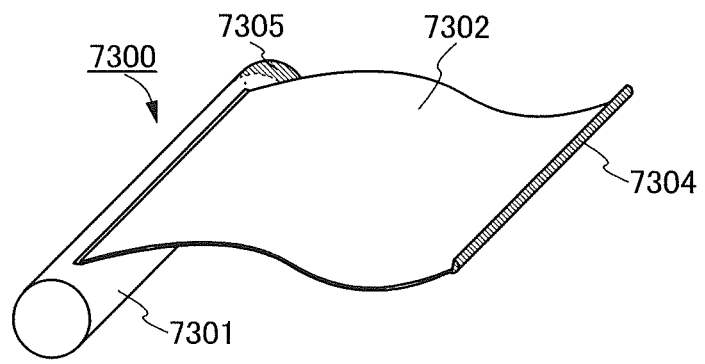

FIG. 15B illustrates a state in which the display portion 7302 is pulled out with the display portion pull 7304. Videos can be displayed on the display portion 7302 in this state. Further, the operation buttons 7303 on the surface of the housing 7301 allow one-handed operation.

Note that a reinforcement frame may be provided for an edge portion of the display portion 7302 in order to prevent the display portion 7302 from being curved when pulled out.

Note that in addition to this structure, a speaker may be provided for the housing so that sound is output with an audio signal received together with a video signal.

The display portion 7302 includes the light-emitting device of one embodiment of the present invention. Thus, the light-emitting device which is flexible and highly reliable is applied to the display portion 7302, which makes the display device 7300 lightweight and highly reliable.

Needless to say, there is no particular limitation to the above electronic appliances and lighting devices as long as the light-emitting device of one embodiment of the present invention is included.

This embodiment can be combined with any of the other embodiments disclosed in this specification as appropriate.

This application is based on Japanese Patent Application serial no. 2012-105553 filed with the Japan Patent Office on May 4, 2012 and Japanese Patent Application serial no. 2013-053332 filed with the Japan Patent Office on Mar. 15, 2012, the entire contents of which are hereby incorporated by reference.

What is claimed is:

1. A method for manufacturing a light-emitting device, comprising:
   providing first and second electrodes over a substrate;
   providing a first organic layer over the first electrode and a second organic layer over the second electrode;
   providing a third electrode over the second organic layer to form a light-emitting element comprising the second and third electrodes, and the second organic layer;
   providing a support over the first electrode and the light-emitting element with a resin layer therebetween;

making a cut overlapping with the first electrode in at least the support;
partly removing the resin layer by using the cut to form an opening overlapping with the first electrode; and
removing the first organic layer remaining on the first electrode after foaming the opening,
wherein the first and second organic layers each contain a light-emitting substance.

2. The method according to claim 1, wherein the first and second organic layers are in contact with the first and second electrodes, respectively.

3. The method according to claim 1, wherein the resin layer includes at least one of a light curable adhesive, a reactive curable adhesive, a heat curable adhesive, and an anaerobic adhesive.

4. The method according to claim 1, wherein the substrate is flexible.

5. The method according to claim 1, wherein the support is flexible.

6. The method according to claim 1, further comprising:
forming a conductive layer in the opening to be in contact with the first electrode.

7. The method according to claim 1, wherein the step of removing the first organic layer remaining on the first electrode is performed using an organic solvent.

8. The method according to claim 1, wherein the first and second organic layers contain the same light-emitting substance.

9. A method for manufacturing a light-emitting device, comprising:
providing a transistor and a first electrode over a substrate;
providing a second electrode electrically connected to the transistor over the transistor with an insulating layer therebetween;
providing a first organic layer over the first electrode and a second organic layer over the second electrode;
providing a third electrode over the second organic layer to form a light-emitting element comprising the second and third electrodes, and the second organic layer;
providing a support over the first electrode and the light-emitting element with a resin layer therebetween;
making a cut overlapping with the first electrode in at least the support;
partly removing the resin layer by using the cut to form an opening overlapping with the first electrode; and
removing the first organic layer remaining on the first electrode after forming the opening,
wherein the first and second organic layers each contain a light-emitting substance.

10. The method according to claim 9, wherein the transistor comprises an oxide semiconductor layer.

11. The method according to claim 9, wherein the first and second organic layers are in contact with the first and second electrodes, respectively.

12. The method according to claim 9, wherein the resin layer includes at least one of a light curable adhesive, a reactive curable adhesive, a heat curable adhesive, and an anaerobic adhesive.

13. The method according to claim 9, wherein the substrate is flexible.

14. The method according to claim 9, wherein the support is flexible.

15. The method according to claim 9, further comprising:
forming a conductive layer in the opening to be in contact with the first electrode.

16. The method according to claim 9, wherein the step of removing the first organic layer remaining on the first electrode is performed using an organic solvent.

17. The method according to claim 9, wherein the first and second organic layers contain the same light-emitting substance.

18. The method according to claim 9, wherein the insulating layer includes a polyimide resin.

* * * * *